(12) United States Patent
Onozawa et al.

(10) Patent No.: US 10,847,609 B2
(45) Date of Patent: Nov. 24, 2020

(54) METHOD OF MANUFACTURING A SEMICONDUCTOR DEVICE IN WHICH A LIFETIME OF CARRIERS IS CONTROLLED

(71) Applicant: FUJI ELECTRIC CO., LTD., Kawasaki (JP)

(72) Inventors: Yuichi Onozawa, Matsumoto (JP); Hiroshi Takishita, Matsumoto (JP); Takashi Yoshimura, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 16/737,330

(22) Filed: Jan. 8, 2020

(65) Prior Publication Data
US 2020/0144360 A1    May 7, 2020

Related U.S. Application Data

(60) Division of application No. 14/793,109, filed on Jul. 7, 2015, now Pat. No. 10,546,919, which is a
(Continued)

(30) Foreign Application Priority Data
Jun. 26, 2013   (JP) ................. 2013-134329

(51) Int. Cl.
*H01L 29/06*    (2006.01)
*H01L 21/268*    (2006.01)
(Continued)

(52) U.S. Cl.
CPC ........ *H01L 29/0615* (2013.01); *H01L 21/263* (2013.01); *H01L 21/2605* (2013.01);
(Continued)

(58) Field of Classification Search
CPC ..... H01L 29/32; H01L 21/263; H01L 21/324; H01L 21/3221; H01L 21/265;
(Continued)

(56) References Cited

U.S. PATENT DOCUMENTS 8,587,025 B1   11/2013   Schulze et al.
9,276,071 B2    3/2016   Yoshimura et al.
(Continued)

FOREIGN PATENT DOCUMENTS

CN   103946985 A    7/2014
EP    1030375 A4    7/2001
(Continued)

*Primary Examiner* — Khiem D Nguyen
(74) *Attorney, Agent, or Firm* — Rabin & Berdo, P.C.

(57) ABSTRACT

A front surface element structure is formed on the front surface side of an n⁻-type semiconductor substrate. Then defects are formed throughout an n⁻-type semiconductor substrate to adjust a carrier lifetime. Hydrogen ions are ion-implanted from a rear surface side of the n⁻-type semiconductor substrate, and a hydrogen implanted region having a hydrogen concentration higher than a hydrogen concentration of a bulk substrate is formed in the surface layer of a rear surface side of the n⁻-type semiconductor substrate.

15 Claims, 40 Drawing Sheets

Related U.S. Application Data continuation of application No. PCT/JP2014/066069, filed on Jun. 17, 2014.

(51) Int. Cl.

| | |
|---|---|
| *H01L 29/861* | (2006.01) |
| *H01L 29/739* | (2006.01) |
| *H01L 21/324* | (2006.01) |
| *H01L 29/32* | (2006.01) |
| *H01L 21/263* | (2006.01) |
| *H01L 29/868* | (2006.01) |
| *H01L 29/66* | (2006.01) |
| *H01L 29/08* | (2006.01) |
| *H01L 21/265* | (2006.01) |
| *H01L 21/26* | (2006.01) |
| *H01L 29/36* | (2006.01) |

(52) U.S. Cl.
CPC ...... *H01L 21/268* (2013.01); *H01L 21/26506* (2013.01); *H01L 21/26513* (2013.01); *H01L 21/324* (2013.01); *H01L 29/0834* (2013.01); *H01L 29/32* (2013.01); *H01L 29/66136* (2013.01); *H01L 29/66333* (2013.01); *H01L 29/66348* (2013.01); *H01L 29/7397* (2013.01); *H01L 29/861* (2013.01); *H01L 29/868* (2013.01); *H01L 29/36* (2013.01)

(58) Field of Classification Search
CPC ............ H01L 29/7395; H01L 29/1095; H01L 29/0615; H01L 29/66333
See application file for complete search history.

(56) References Cited

U.S. PATENT DOCUMENTS

| | | | |
|---|---|---|---|
| 9,443,774 B2 * | 9/2016 | Mizushima | ............. H01L 29/32 |
| 2008/0315364 A1 | 12/2008 | Nemoto | |
| 2009/0184340 A1 | 7/2009 | Nemoto et al. | |
| 2009/0224284 A1 * | 9/2009 | Nemoto | .............. H01L 21/2255 |
| | | | 257/109 |
| 2011/0140243 A1 | 6/2011 | Misumi et al. | |
| 2011/0233731 A1 * | 9/2011 | Yamazaki | ........... H01L 21/2605 |
| | | | 257/617 |
| 2012/0267681 A1 | 10/2012 | Nemoto et al. | |
| 2013/0062623 A1 | 3/2013 | Shimizu et al. | |
| 2013/0075783 A1 | 3/2013 | Yamazaki et al. | |
| 2014/0117502 A1 | 5/2014 | Laven et al. | |
| 2014/0246755 A1 | 9/2014 | Yoshimura et al. | |
| 2014/0291723 A1 * | 10/2014 | Miyazaki | ................ H01L 29/36 |
| | | | 257/139 |
| 2015/0024556 A1 | 1/2015 | Miyazaki et al. | |
| 2015/0069462 A1 | 3/2015 | Mizushima | |
| 2016/0163786 A1 | 6/2016 | Yoshimura et al. | |

FOREIGN PATENT DOCUMENTS

| | | |
|---|---|---|
| EP | 2793251 A1 | 10/2014 |
| JP | H08-102545 A | 4/1996 |
| JP | 2008-211148 A | 9/2008 |
| JP | 2009-176892 A | 8/2009 |
| JP | 2009188336 A | 8/2009 |
| JP | 2010114368 A | 5/2010 |
| JP | 2011-049300 A | 3/2011 |
| JP | 2013-074181 A | 4/2013 |
| WO | 0/016408 A1 | 3/2000 |
| WO | 2013/100155 A1 | 7/2013 |

* cited by examiner

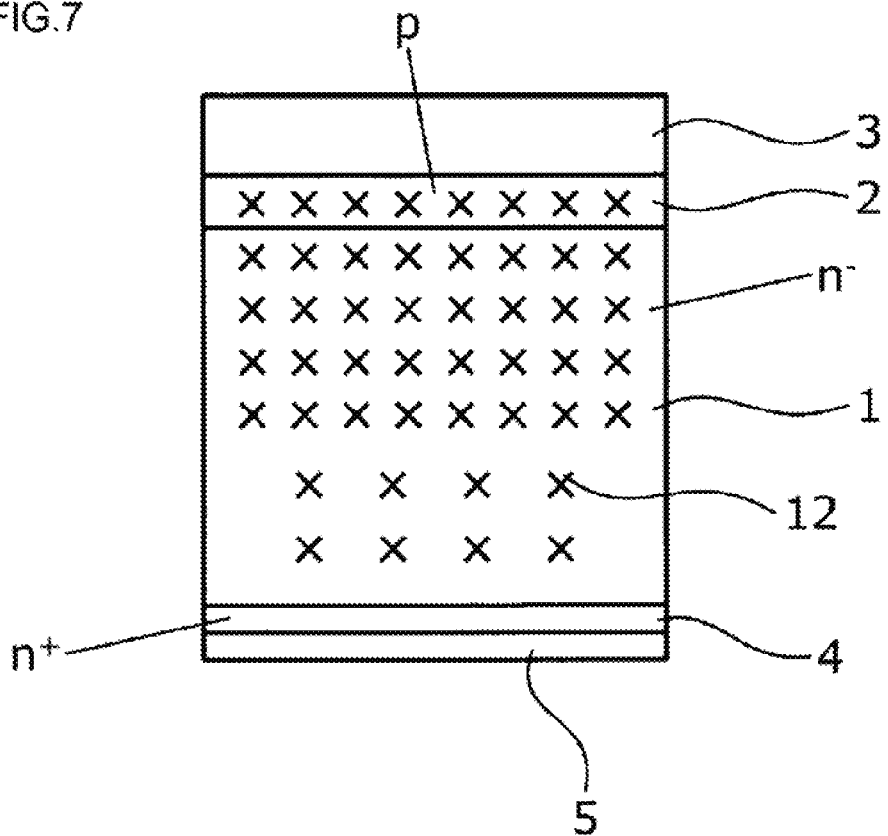

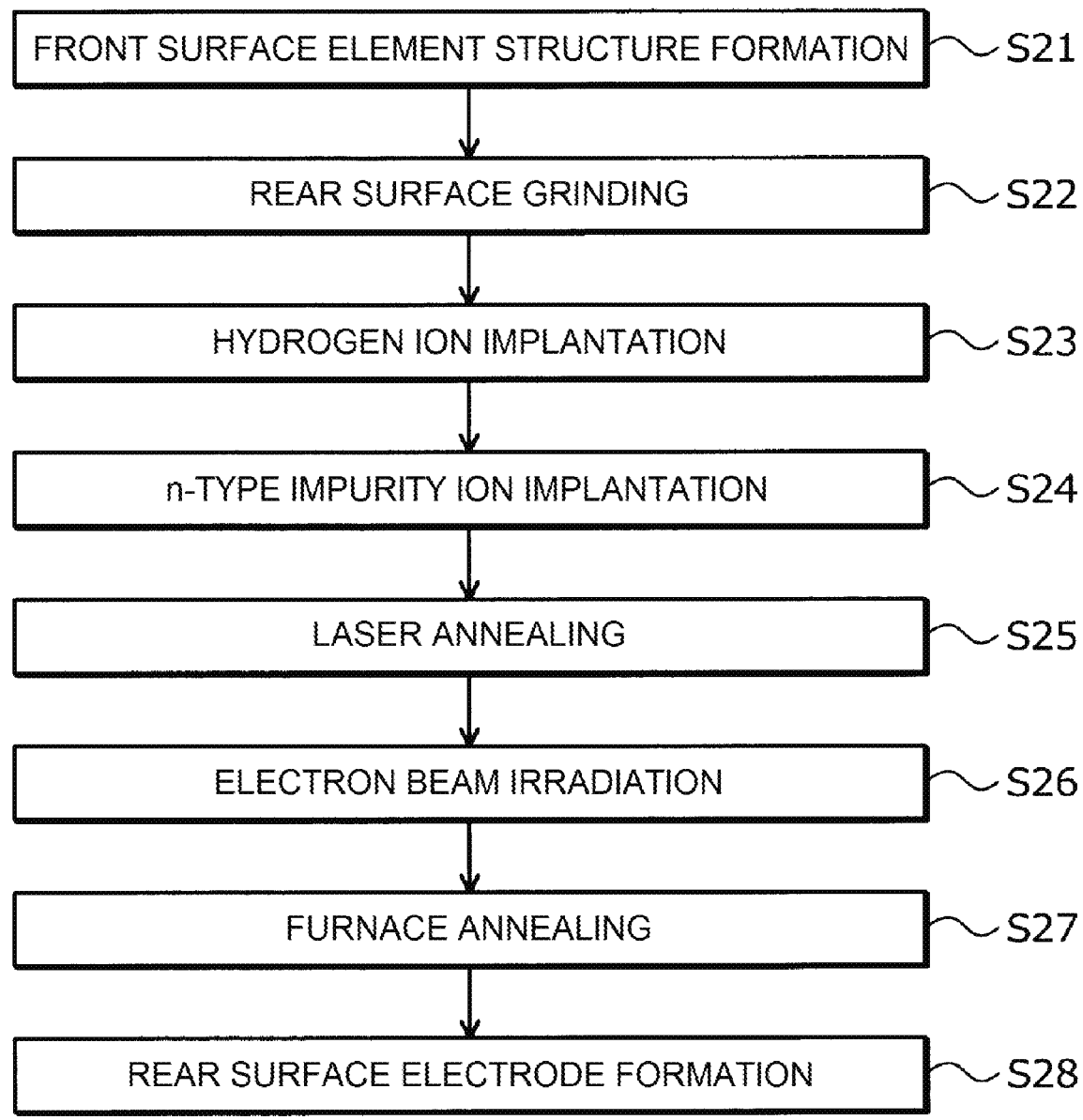

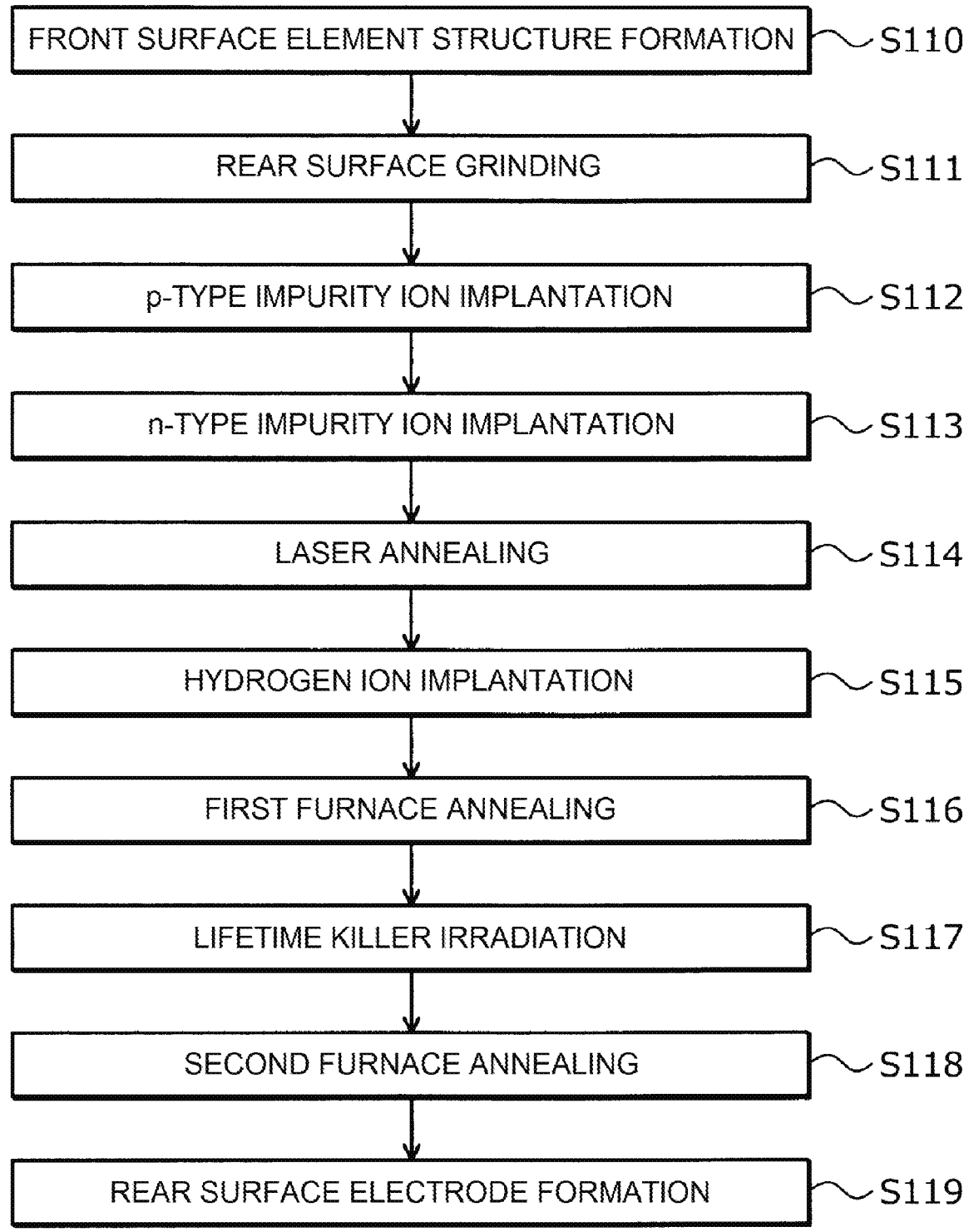

METHOD OF MANUFACTURING A SEMICONDUCTOR DEVICE IN WHICH A LIFETIME OF CARRIERS IS CONTROLLED

CROSS-REFERENCE TO RELATED APPLICATIONS

This is a division of U.S. patent application Ser. No. 14/793,109, filed on Jul. 7, 2015 issued as U.S. Pat. No. 10,546,919, which is a continuation under 35 U.S.C. 120 of International Application PCT/JP2014/066069 having the International Filing Date of Jun. 17, 2014, and having the benefit of the earlier filing date of Japanese Application No. 2013-134329, filed on Jun. 26, 2013. All of the identified applications are fully incorporated herein by reference.

TECHNICAL FIELD

The present invention relates to a semiconductor device and a semiconductor device manufacturing method.

BACKGROUND ART

As a semiconductor device used for power semiconductor devices, diodes and IGBTs (Insulated Gate Bipolar Transistor) having a withstand voltage of 400V, 600 V, 1200V, 1700V, 3300V or more are known. These diodes and IGBTs are used for power conversion devices, such as convertors and invertors, and are demanded to have low loss, low noise and high breakdown tolerance, as well as low cost. As an example of the semiconductor device used for power semiconductor devices, a pin (p-intrinsic-n) diode will be described.

FIG. 36 is a cross-sectional view depicting a key portion of a conventional diode. As illustrated in FIG. 36, in the conventional diode, a p-type layer (not illustrated) is selectively disposed on a front surface side of an $n^-$-type semiconductor substrate to be an $n^-$-type drift layer 101, and in the p-type layer, a p-type anode layer 102 is selectively disposed, and a termination withstand voltage structure is disposed on a periphery surrounding the p-type anode layer 102. On the rear surface side of the $n^-$-type semiconductor substrate, an $n^+$-type cathode layer 104 is disposed in a position on the opposite side of the p-type anode layer 102. The reference numeral 103 denotes an anode electrode, and 105 denotes a cathode electrode.

In the case of the conventional diode, a reverse recovery loss is reduced by introducing heavy metal or defects into the n-type drift layer 101, so that the carrier lifetime of the $n^-$-type drift layer 101 is decreased, and annihilation of the carriers is quickened during reverse recovery. At this time, if a carrier lifetime distribution, in which the carrier lifetime on the cathode side of the $n^-$-type drift layer 101 is longer than the carrier lifetime on the anode side, is created, reverse recovery current/voltage waveforms, where oscillation of current/voltage waveforms during reverse recovery or surge (current generated by a transition abnormal voltage) due to oscillation of voltage waveforms are hardly generated and recovery is soft, can be obtained.

According to a proposed semiconductor device, in which the carrier lifetime is controlled like this, (e.g. Patent Document 1 (paragraph 0037)), defects, which were formed in the drift region when hydrogen ions are irradiated from the rear surface of the silicon substrate, have a peak in a position deeper than the intermediate depth of the drift region from the substrate front surface, and recombination of the carriers in a position deeper than the intermediate depth of the drift region from the substrate front surface is accelerated, whereby the carrier lifetime control function is implemented.

According to another proposed device (e.g. Patent Document 2), lifetime of carriers near the pn junction between the p-type anode layer and the $n^-$-type drift layer and the lifetime of carriers near the $n^-n^+$ junction between the $n^-$-type drift layer and the $n^+$-type cathode layer in the $n^-$-drift layer are controlled by a double sided irradiation or protons, or by a double irradiation of protons and electron beams, so that the lifetime of carriers near the pn junction is controlled to be shorter than the lifetime of carriers near the $n^-n^+$ junction.

Patent Document 1: Japanese Patent Application Laid-open No. 2011-049300
Patent Document 2: Japanese Patent Application Laid-open No. H08-102545

DISCLOSURE OF THE INVENTION

There is a method for obtaining the above mentioned predetermined carrier lifetime distribution by selectively irradiating such light ions as helium (He) and protons onto the anode side of the $n^-$-type drift layer and decreasing the lifetime of the carriers in a portion where the light ions are irradiated, but in this case, the light ion irradiation device itself is expensive, which increases the manufacturing cost, and leak current may increase. It is also possible to locally decrease the carrier lifetime by dispersion of heavy metal, such as platinum (Pt), but problems are that the temperature characteristic of the reverse recovery current-voltage (I-V) curve becomes negative, and a dedicated manufacturing line is required to prevent heavy metal contamination.

One method for controlling a lifetime of carriers at low cost, without generating problems resulting from light ion irradiation and heavy metal diffusion, is decreasing the lifetime of carriers by generating defects in the semiconductor substrate by electron beam irradiation. However, in the case of electron beam irradiation which has high acceleration energy, an electron beam transmits through the semiconductor substrate, and the carrier lifetime becomes uniform. If the acceleration energy is decreased by locally decreasing the carrier lifetime, defects may not be generated because the mass of electrons is small. Thus in the case of electron beam irradiation, it is difficult to selectively form defects in the semiconductor substrate and locally control the carrier lifetime.

To solve the problems of the prior art described above, it is an object of the present invention to provide a semiconductor device and a semiconductor manufacturing method that can locally control carrier lifetime at low cost without increasing leak current or contaminating the manufacturing line.

To solve the above mentioned problems and to achieve the object of the present invention, a semiconductor device manufacturing method according to the present method is a semiconductor device manufacturing method in which the lifetime of carriers is locally controlled, and has the following characteristics. An electron beam irradiation step of irradiating an electron beam from a front surface side of a semiconductor substrate and generating dangling bonds by breaking the inter-atomic bonds of atoms constituting the semiconductor substrate is executed so as to form defects in the semiconductor substrate. After the electron beam irradiation step, a first step of implanting hydrogen atoms from a rear surface side of the semiconductor substrate and making the hydrogen concentration on the rear surface side of the semiconductor substrate to be higher than the hydrogen concentration of the semiconductor substrate before starting the manufacturing of the semiconductor device is executed, so as to recover the defects in the region where the hydrogen atoms have been implanted and increase the lifetime of the carriers in the region where the hydrogen atoms have been implanted.

The semiconductor device manufacturing method according to the present invention is characterized in that the above mentioned invention further includes a second implantation step of implanting impurities from the rear surface side of the semiconductor substrate after the electron beam irradiated step, and the first implantation step is executed simultaneously with the second implantation step.

The semiconductor device manufacturing method according to the present invention is characterized in that the above mentioned invention further includes a laser irradiation step of irradiating a laser from the rear surface side of the semiconductor substrate after the first implantation step and after the second implantation step, so as to activate the impurities, and hydrogen atoms are implanted at a depth less than a penetration depth of the laser in the first implantation step.

The semiconductor device manufacturing method according to the present invention is characterized in that the above mentioned invention further includes a step of forming a second conductivity type layer on a surface layer of the front surface of the semiconductor substrate of first conductivity type, and the impurities of first conductivity type are implanted in the second implantation step, so as to form a first conductivity type layer on a surface layer of the rear surface of the semiconductor substrate.

The semiconductor device manufacturing method according to the present invention is characterized in that the above mentioned invention further includes, before the first implantation step before executing the electron beam irradiation step or after executing the electron beam irradiation step, a second implantation step of implanting helium from the rear surface side of the semiconductor substrate and decreasing the lifetime of carriers in the region where helium has been implanted. In the first implantation step, the lifetime of the carriers in at least a part of the region where helium has been implanted is increased.

The semiconductor device manufacturing method according to the present invention is characterized in that the lifetime of the carriers in a region which is depleted during ON time is increased in the first implantation step.

To solve the above mentioned problems and achieve the object of the present invention, a semiconductor device according to the present invention is a semiconductor device in which the lifetime of carriers is locally controlled and has the following characteristics. Defects are formed in a semiconductor substrate by dangling bonds generated by breaking of inter-atomic bonds of atoms constituting the semiconductor substrate. A high hydrogen concentration region, of which hydrogen concentration is higher than a front surface side of the semiconductor substrate, is formed in a surface layer of a rear surface of the semiconductor substrate by introducing hydrogen atoms. In the high hydrogen concentration region, defects are less than those on the front surface side of the semiconductor substrate, and the lifetime of the carriers is longer than that on the front surface side of the semiconductor substrate.

The semiconductor device according to the present invention is characterized in that the above mentioned invention further includes a second conductivity type layer which is formed on the surface layer of the front surface of the semiconductor substrate, and a first conductivity type layer which is formed on the surface layer of the rear surface of the first conductivity type semiconductor substrate.

The semiconductor device according to the present invention is characterized in that the hydrogen concentration in the high hydrogen concentration region is higher than the hydrogen concentration of bulk single crystals.

According to the above mentioned invention, the defects are formed throughout the semiconductor substrate by electron beam irradiation, and then the defects on the substrate rear surface side are locally recovered by the hydrogen ion implantation from the substrate rear surface, whereby the carrier lifetime on the substrate rear surface side can be made longer than the carrier lifeline on the substrate front surface side. Therefore even if the carrier lifetime control is performed using electron beam irradiation, the carrier lifetime can be locally controlled.

According to the semiconductor device and the semiconductor device manufacturing method of the present invention, carrier lifetime can be locally controlled at low cost without increasing leak current or contaminating the manufacturing line.

BRIEF DESCRIPTION OF THE DRAWINGS

FIG. 7 is a cross-sectional view depicting a state during manufacturing the semiconductor device according to Embodiment 1;

FIG. 13 is a flow chart depicting an overview of a semiconductor device manufacturing method according to Embodiment 3;

FIG. 29A is a flow chart depicting an overview of a semiconductor device manufacturing method according to Embodiment 12;

BEST MODE FOR CARRYING OUT THE INVENTION

Preferred embodiments of a semiconductor device and a semiconductor device manufacturing method according to the present invention will be described in detail with reference to the accompanying drawings. In this description and in the accompanying drawings, a layer or a region with an n or p superscript means that the majority carrier of the layer or the region is electrons or holes respectively. + or − attached to n or p indicates that the impurity concentration is higher or lower respectively than a layer or a region where + or − is not attached. In the following description of the embodiments and the accompanying drawings, a same composing element is denoted with a same reference symbol, for which redundant description is omitted.

Embodiment 1

Figure 1:
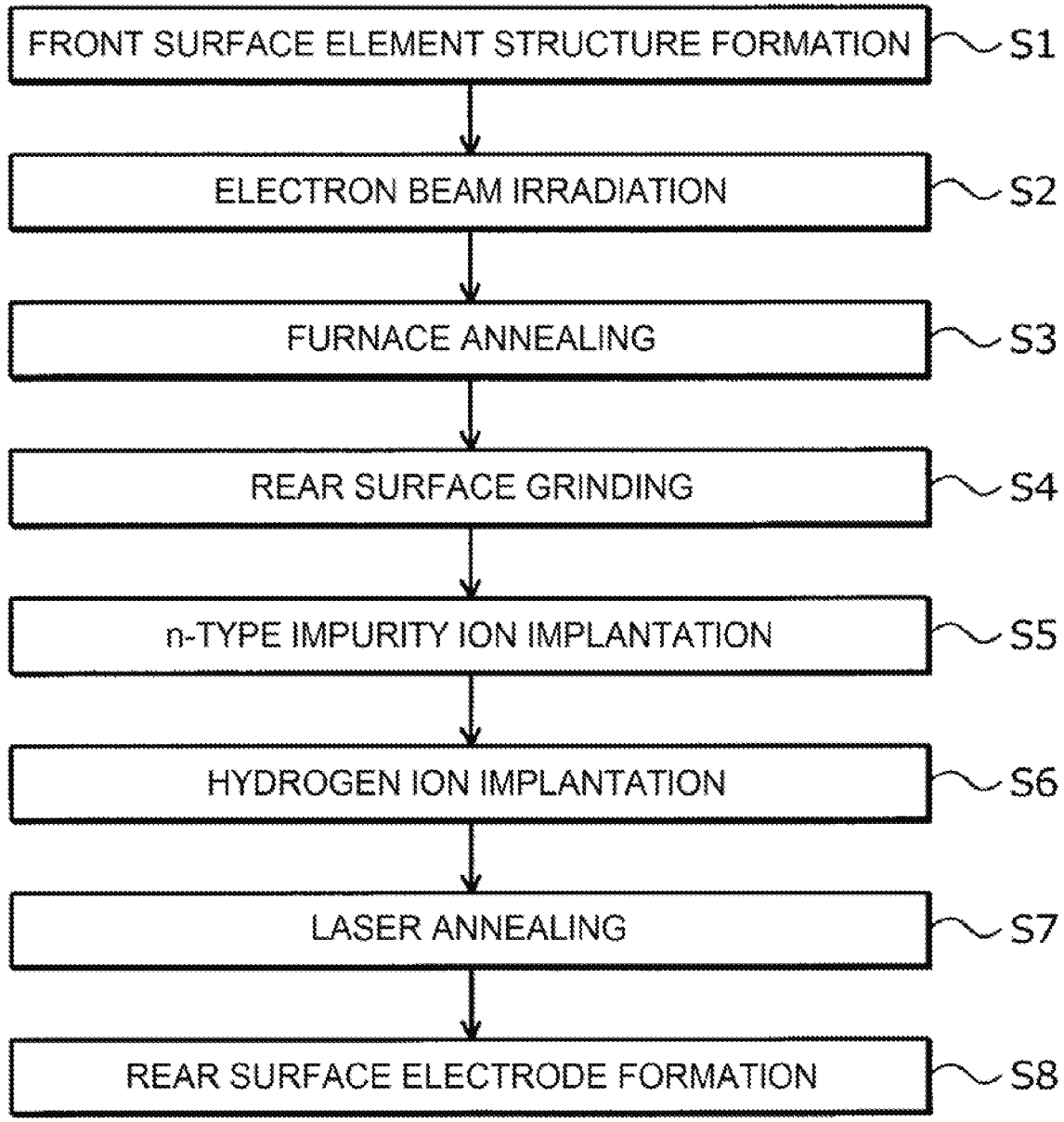
FIG. 1 is a flow chart depicting an overview of a semiconductor device manufacturing method according to Embodiment 1.
Figure 8A:
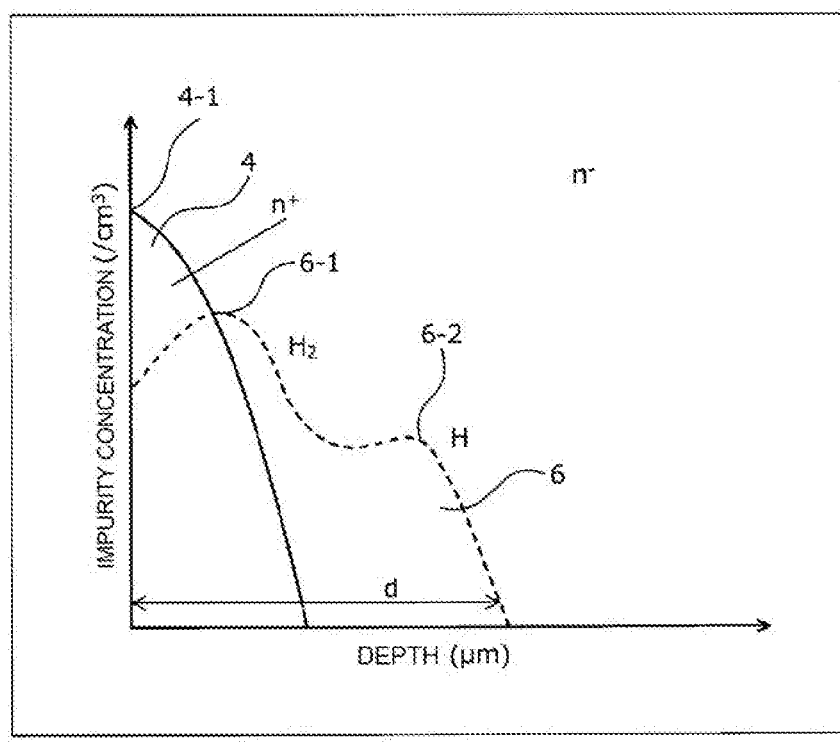
FIG. 8A is a characteristic diagram depicting an impurity concentration distribution of the semiconductor device according to Embodiment 1.
Figure 8B:
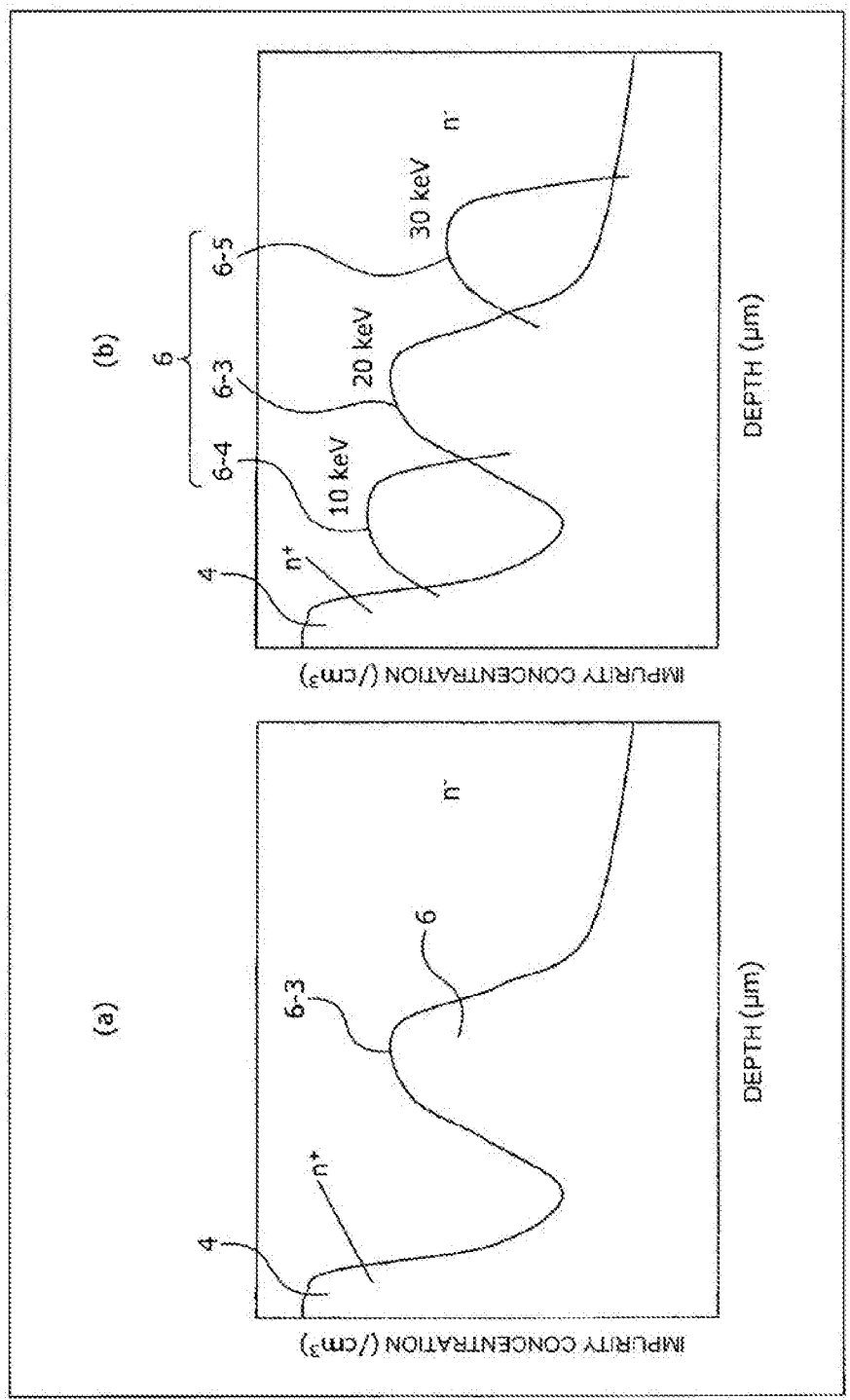
FIG. 8B is a characteristic diagram depicting an impurity concentration distribution of the semiconductor device according to Embodiment 1.

A semiconductor device manufacturing method according to Embodiment 1 will be described using an example of fabricating (manufacturing) a pin diode. FIG. 1 is a flow chart depicting an overview of the semiconductor device manufacturing method according to Embodiment 1. FIG. 2 to FIG. 7 are cross-sectional views depicting a state during manufacturing the semiconductor according to Embodiment 1. FIG. 8A and FIG. 8B are characteristic diagrams depicting an impurity concentration distribution of the semiconductor device according to Embodiment 1. First, a front surface element structure constituted by a p-type anode layer 2, an anode electrode 3, a terminal withstand voltage structure (not illustrated), and a passivation film (not illustrated) is formed on the front surface side of an n-type semiconductor substrate to be an $n^-$-type drift layer 1 (step S1). In concrete terms, a p-type layer to be a p-type anode layer 2 and a p-type layer to be a guard ring constituting the terminal withstand voltage structure are selectively formed on the surface layer of the front surface of the n-type semiconductor substrate.

Then PSG (Phospho Silicate Glass), for example, is formed as an inter-layer insulation film (not illustrated), so as to cover the front surface of the n-type semiconductor substrate. Then the inter-layer insulation film is selectively removed, and a contact hole to expose the p-type anode layer 2 and the guard ring is formed. Then as a field plate for the anode electrode 3 and the terminal withstand voltage structure, an Al—Si (Aluminum-Silicon) film, for example, is deposited to be implanted in the contact hole, whereby a passivation film is formed on the Al—Si film. The terminal withstand voltage structure is a region that surrounds an active region where the p-type anode layer 2 is formed, and maintains the withstand voltage by relaxing the electric field on the substrate front surface side. The active region is a region where current flows in the ON state.

Figure 2:
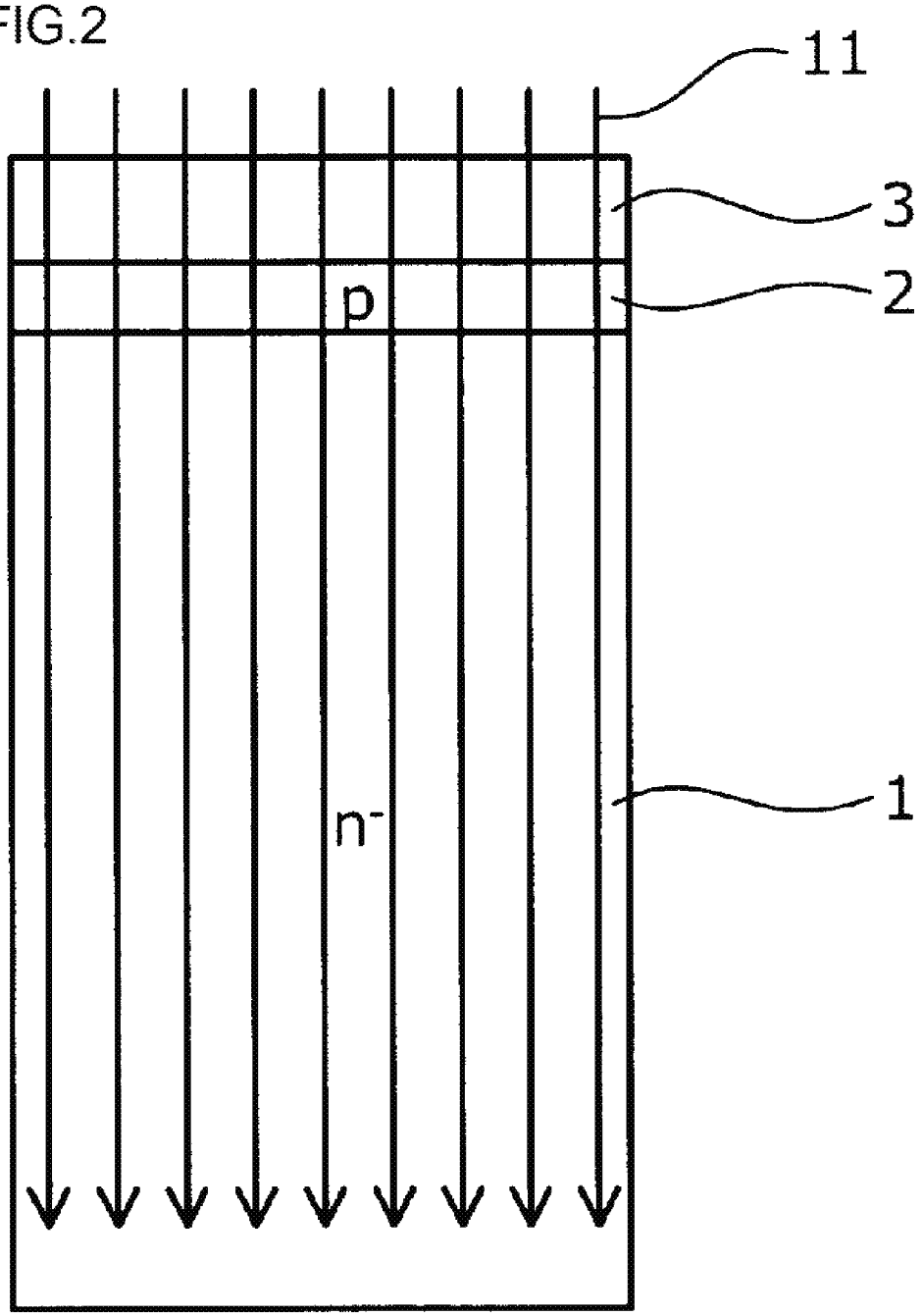
FIG. 2 is a cross-sectional view depicting a state during manufacturing the semiconductor device according to Embodiment 1.
Figure 3:
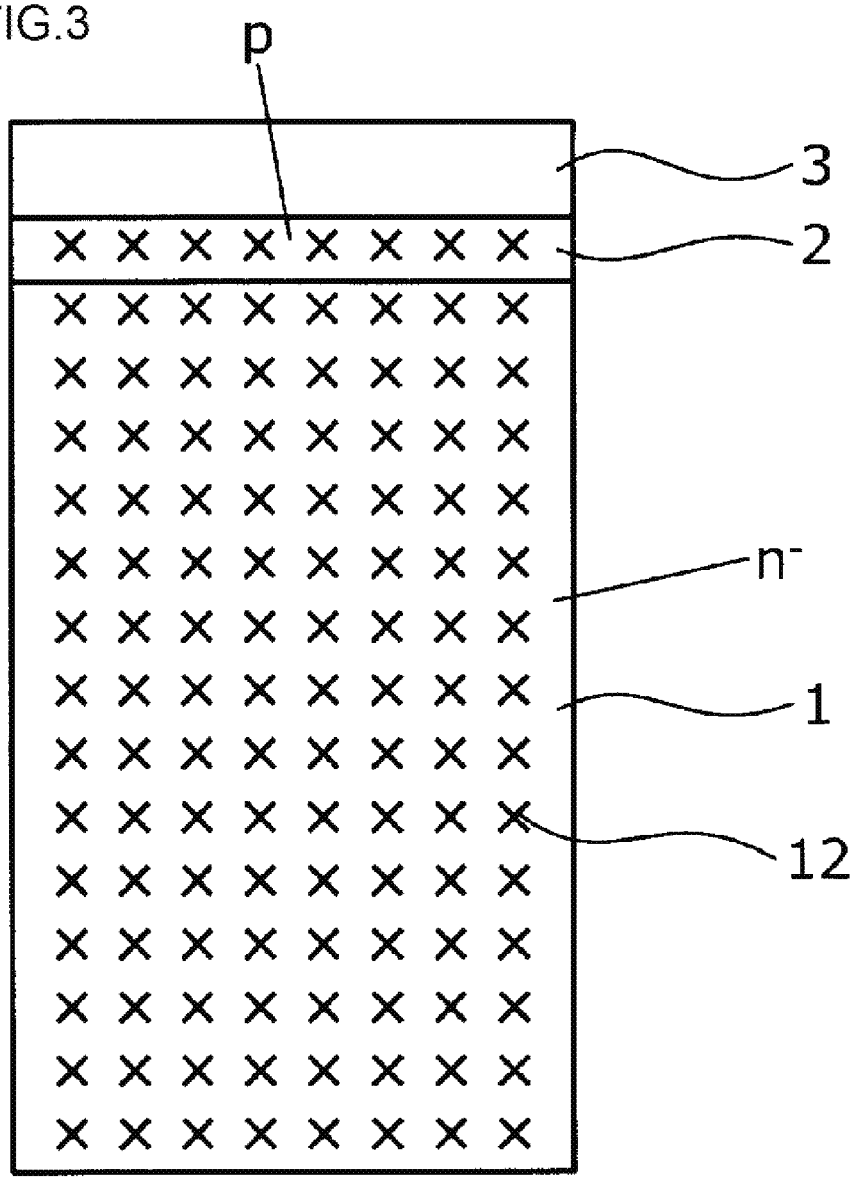
FIG. 3 is a cross-sectional view depicting a state during manufacturing the semiconductor device according to Embodiment 1.

Then as illustrated in FIG. 2, electron beams are irradiated (hereafter called "electron beam irradiation 11") throughout the n⁻-type semiconductor substrate from the front surface side of the n⁻-type semiconductor substrate (step S2). For the electron beam irradiation 11, the acceleration energy may be 1 MeV or more, 10 MeV or less, and the dose may be 20 kGy or more, 600 kGy or less (preferably 90 kGy or more, 200 kGy or less), for example. Then as illustrated in FIG. 3, furnace annealing (heat treatment) is performed at a temperature of 330° C. or more, 380° C. or less (e.g. 360° C.) for one hour or more, five hours or less (step S3).

By the electron beam irradiation 11 and furnace annealing in steps S2 and S3, defects (lattice defects) 12 are formed through the n⁻-type semiconductor substrate, for example, and the carrier lifetime is adjusted so that an appropriate ON voltage and reverse recovery loss are implemented. The defects 12 formed by the electron beam irradiation 11 are holes formed by the dangling bonds generated by breaking of the inter-atomic bonds of silicon (Si) of the n⁻-type semiconductor substrate by the electron beam irradiation 11. In FIG. 3, × indicates a defect 12 (the same for FIG. 4 to FIG. 7).

Figure 4:
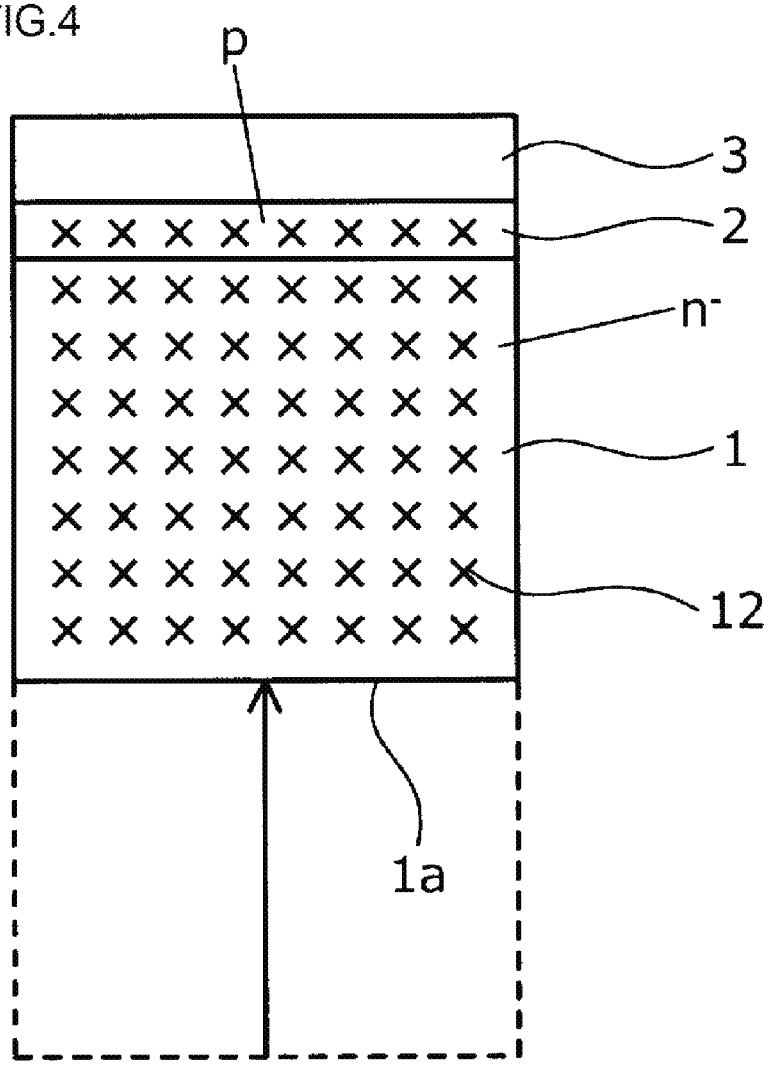
FIG. 4 is a cross-sectional view depicting a state during manufacturing the semiconductor device according to Embodiment 1.
Figure 5:
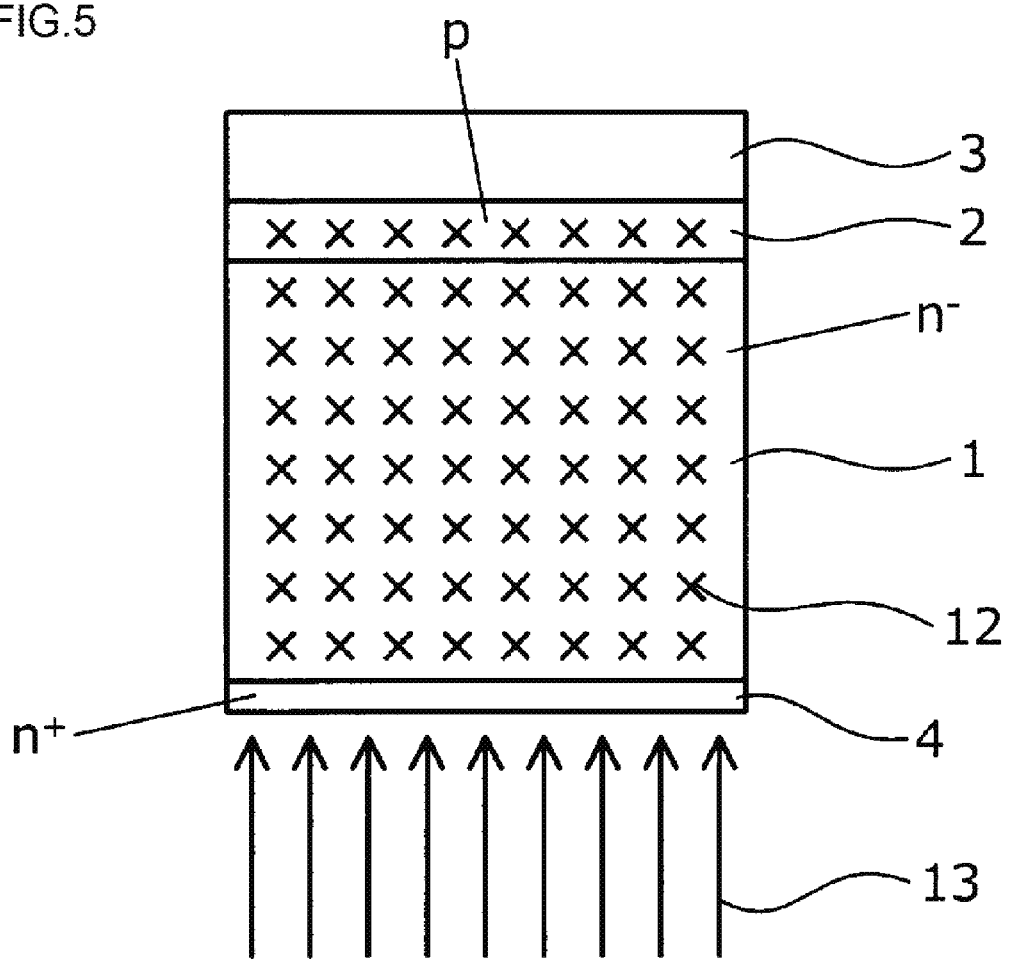
FIG. 5 is a cross-sectional view depicting a state during manufacturing the semiconductor device according to Embodiment 1.

Then as illustrated in FIG. 4, the n⁻-semiconductor substrate is ground from the rear surface side until reaching the position 1a at which actual thickness of the semiconductor device as a product is implemented (step S4). Then as illustrated in FIG. 5, n-type impurities, such as phosphorus (P) and arsenic (As), are ion-implanted, (hereafter called "n⁻-type impurity ion implantation 13": second implantation step) from the ground rear surface side of the n-type semiconductor substrate, whereby an n⁺-type cathode layer 4 is formed on the surface layer of the rear surface of the n⁻-type semiconductor substrate (step S5).

The dose of the n-type impurity ion implantation 13 is $1.0 \times 10^{15}/cm^2$ or more, $1.0 \times 10^{16}/cm^2$ or less, for example. The acceleration energy of the n-type impurity ion-implantation 13 is an energy that does not generate defects (lattice defects) in the n⁺-cathode layer 4, or is an energy with which the defects generated by the n-type impurity ion implantation 13 are recovered by the later mentioned hydrogen ion implantation and laser annealing. In concrete terms, the acceleration energy of the n-type impurity ion implantation 13 may be 20 keV to 100 keV, for example, and is preferably about 70 keV to 80 keV.

Figure 6:
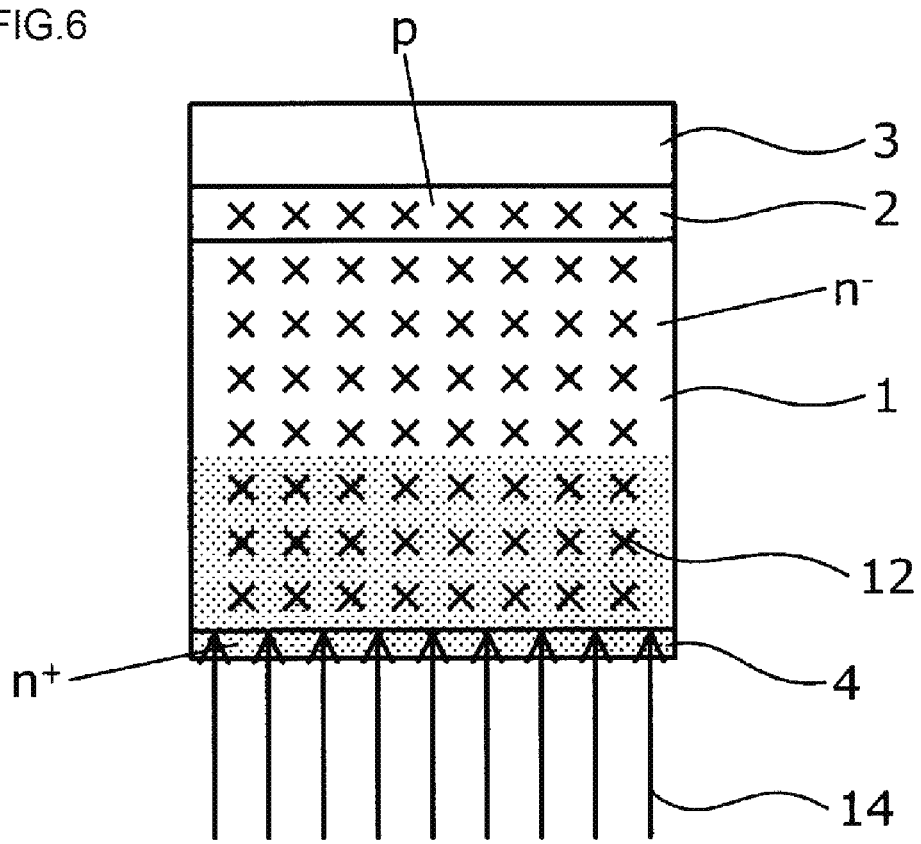
FIG. 6 is a cross-sectional view depicting a state during manufacturing the semiconductor device according to Embodiment 1.

Then as illustrated in FIG. 6, hydrogen (H) is ion-implanted (hereafter called "hydrogen ion implantation 14": first implantation step) from the ground rear surface side of the n⁻-type semiconductor substrate, whereby the hydrogen implanted region having a hydrogen concentration not lower than the hydrogen concentration of the n⁻-type semiconductor substrate before the start of the manufacturing steps is formed (step S6). The hydrogen concentration of the n⁻-type semiconductor substrate before the start of the manufacturing steps refers to the hydrogen concentration of bulk single crystal silicon grown by a standard crystal growth method, such as the Czochralski Method and the Float Zone Method. The hatched region in FIG. 6 indicates the hydrogen implanted region. The implantation depth of the hydrogen ion implantation 14 is preferably not greater than the penetration depth of a laser from the substrate rear surface in the later mentioned laser annealing.

In concrete terms, the acceleration energy of the hydrogen ion implantation 14 is about 5 keV or more, 500 keV or less, preferably about 5 keV or more, 250 keV or less, for example. It is preferable that the range Rp of the hydrogen ion implantation 14 (that is, depth of the hydrogen implanted region from the substrate rear surface) is relatively shallow, such as 0.1 μm or more, 3 μm or less (acceleration energy in this case is about 5 keV or more, 250 keV or less, for example). This is because the hydrogen termination of the dangling bonds is accelerated, and the defects 12 generated by the electron beam irradiation 11 are more easily recovered. In the hydrogen implanted region, the defects 12 generated by the electron beam irradiation 11 is locally recovered, and the defects generated by the n-type impurity ion implantation 13 is locally recovered. Thereby the lifetime of carriers on the rear surface side (cathode side) of the n⁻-type semiconductor substrate becomes longer than the lifetime of carriers on the front surface side (anode side) of the n-type semiconductor substrate. The acceleration energy with which the Rp of the hydrogen ion implantation 14 becomes 0.1 μm is about 5 keV, and the acceleration energy with which this Rp becomes 3 μm is about 500 keV. The hydrogen dose of the hydrogen ion implantation 14 is preferably about $1.0 \times 10^{13}/cm^2$ or more, for example. This is because the ON voltage Vf can be decreased and the soft recovery characteristic of the diode can be improved as the hydrogen dose increases.

The n-type impurity ion implantation 13 and the hydrogen ion implantation 14 may be executed in reverse order (mass separation implantation) or may be executed simultaneously (non-mass separation implantation). If the n-type impurity ion implantation 13 and the hydrogen ion implantation 14 are executed simultaneously by non-mass separation implantation, ion implantation, of which ion source is a mixed gas containing n-type impurities and hydrogen (hydrogen atoms (H) and hydrogen molecules ($H_2$)), such as hydrogen phosphide (PHx (x=1~5): e.g. phosphine ($PH_3$)) and hydrogen arsenide (AsHx: e.g. arsine ($AsH_3$)), is performed with an acceleration energy of about 10 keV to 1 MeV. In this case, the ion implantation is performed such that the dose of the n-type impurity becomes the dose of the n-type impurity ion implantation 13 with the above mentioned acceleration energy of the n-type impurity ion implantation 13. The dose of the hydrogen in this ion implantation is determined by a number of hydrogen atoms included in the composition formula of the mixed gas to be the ion source, hence the dose of hydrogen enters the above mentioned preferable range.

Then the n⁺-type cathode layer 4 is activated by laser annealing, for example (step S7). For the laser annealing in step S7, a YAG laser or a semiconductor laser may be used, or a CW (Continuous Wave) laser may be combined with the YAG laser or the semiconductor laser. In step S7, furnace annealing, such as RTA (Rapid Thermal Annealing), may be performed instead of laser annealing. To perform the furnace annealing in step S7, it is preferable to perform the furnace annealing at a temperature of 300° C. or more, 500° C. or less, for 30 minutes or more, 10 hours or less, for example, and in concrete terms, the furnace annealing at 350° C. for about 1 hour, for example, is preferable. Then a cathode electrode 5, that contacts the n⁺-type cathode layer 4, is formed as the rear surface electrode (step S8), whereby the pin diode illustrated in FIG. 7 is completed.

FIG. 8A and FIG. 8B show the impurity concentration distribution on the rear surface side (cathode side) of the n⁻-type semiconductor substrate of the completed pin diode. FIG. 8A shows the impurity concentration distribution when the n-type impurity ion implantation 13 and the hydrogen ion implantation 14 are simultaneously performed by non-mass separation implantation. FIG. 8B shows the impurity concentration distribution when the n-type impurity ion implantation 13 and the hydrogen ion implantation 14 are separately performed by mass separation implantation. In FIG. 8A and FIG. 8B, the depth=0 μm is the position of the ground rear surface of the n⁻-type semiconductor substrate (that is, the interface between the n⁺-type cathode layer 4 and the cathode electrode 5), and the portion deeper than the n⁺-type cathode layer 4 is the n-type drift layer 1 (the same for FIG. 12A and FIG. 12B).

As shown in FIG. 8A, in the case of the non-mass separation implantation, the hydrogen implanted region 6 formed by the hydrogen ion implantation 14 has a first concentration peak 6-1 of the hydrogen molecules ($H_2$), and a second concentration peak 6-2 of the hydrogen atoms (H) which is formed in a deeper portion from the substrate rear surface than the first concentration peak 6-1. The first and second concentration peaks 6-1 and 6-2 of the hydrogen implanted region 6 are formed in deeper positions from the substrate rear surface than the concentration peak 4-1 of the n⁺-type cathode layer 4. The first concentration peak 6-1 is formed corresponding to the hydrogen molecules, and the second concentration peak 6-2 is formed corresponding to the hydrogen atoms. In FIG. 8A, the reference character d denotes the depth of the hydrogen implanted region 6 from the substrate rear surface (that is, the implantation depth of the hydrogen ion implantation 14). The first and second concentration peaks 6-1 and 6-2 of the hydrogen implanted region 6 are formed to overlap with each other. In other words, the width in the depth direction (thickness) of the hydrogen implanted region 6, generated by non-mass separation implantation, is the width from the edge of the first concentration peak of the hydrogen molecules ($H_2$) on the substrate rear surface side to the edge of the second concentration peak of the hydrogen atoms on the substrate front surface side. Therefore the defects generated by the electron beam irradiation can be recovered in a wide range where the hydrogen implanted region 6 is formed.

In the case of the mass-separation implantation, on the other hand, the hydrogen implanted region 6, formed by the hydrogen ion implantation 14, has one concentration peak 6-3 of the hydrogen atoms, as shown in FIG. 8B (a). Therefore compared with the case of the non-mass separation implantation, the width of the hydrogen implanted region 6 in the depth direction becomes narrow, but in the case of th mass separation implantation, a dedicated ion implantation device is not required, and an existent ion implantation device can be used. Therefore cost can be reduced. Further, a plurality of concentration peaks 6-3 to 6-5 of the hydrogen atoms can be generated in different depths from the substrate rear surface, as shown in FIG. 8B (b), by performing a plurality of times of hydrogen ion implantation 14 based on the mass separation implementation using a different acceleration energy. For example, it is assumed that one concentration peak 6-3 of the hydrogen atoms was generated by performing one hydrogen ion implantation 14 based on the mass separation implementation at acceleration energy 20 keV. In this case, if two times of hydrogen ion implantation 14 are performed at acceleration energy 10 keV and 30 keV, one concentration peak 6-3 of the hydrogen atoms can be generated in a region at a 1 μm or less depth from the substrate rear surface, and the concentration peaks 6-4 and 6-5 of the hydrogen atoms can be generated on the substrate rear surface side and on the substrate front surface side of the concentration peak 6-3 respectively. Hence the hydrogen implanted region 6 can be formed in a range equivalent to the non-mass separation implantation by generating a concentration peak 6-3 and concentration peaks 6-4 and 6-5, so as to overlap with one another by appropriately adjusting each acceleration energy of a plurality of times of hydrogen ion implantation 14.

Figure 9:
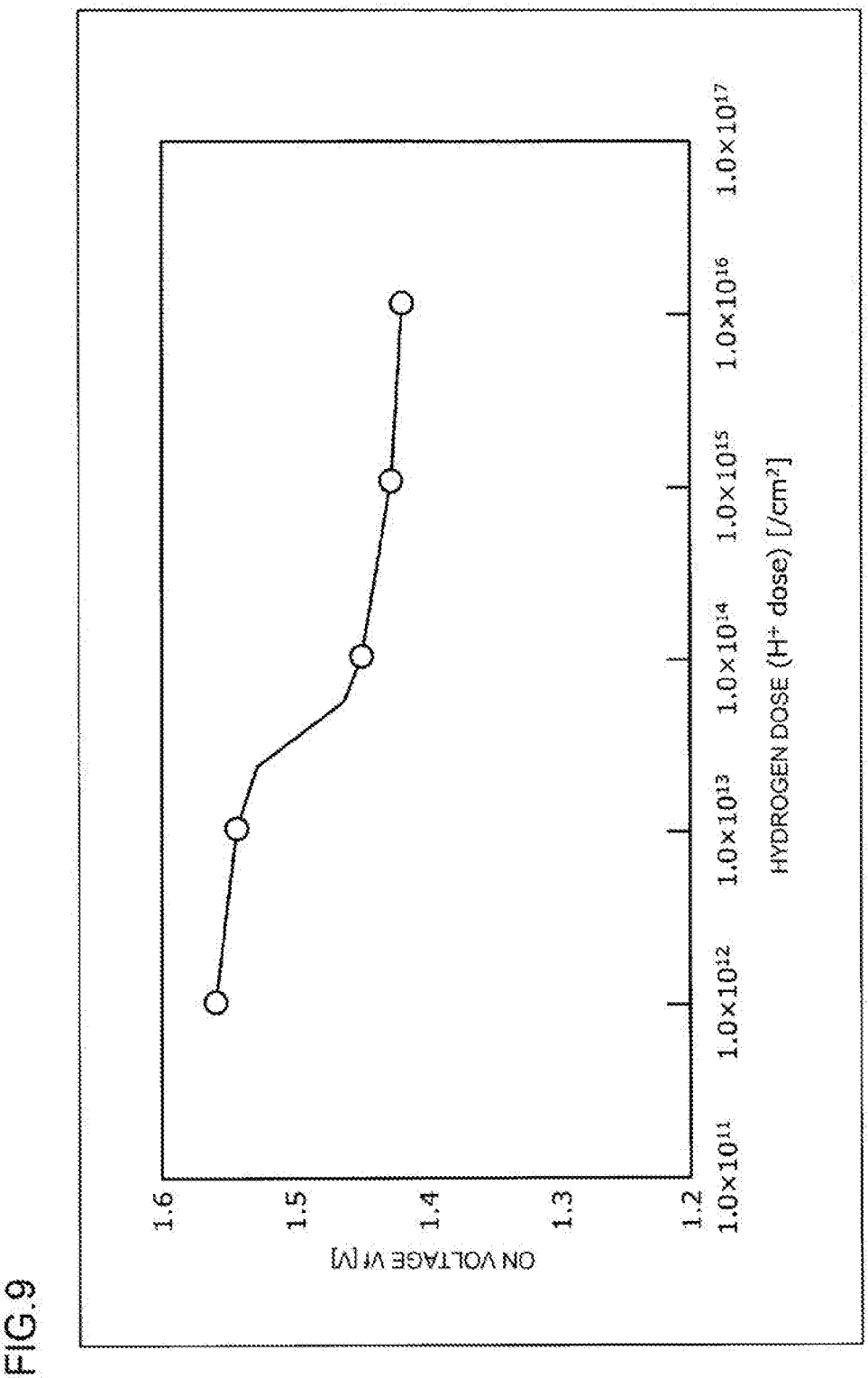
FIG. 9 is a characteristic diagram depicting the hydrogen dose dependency of the ON voltage of the semiconductor device according to Embodiment 1.
Figure 10:
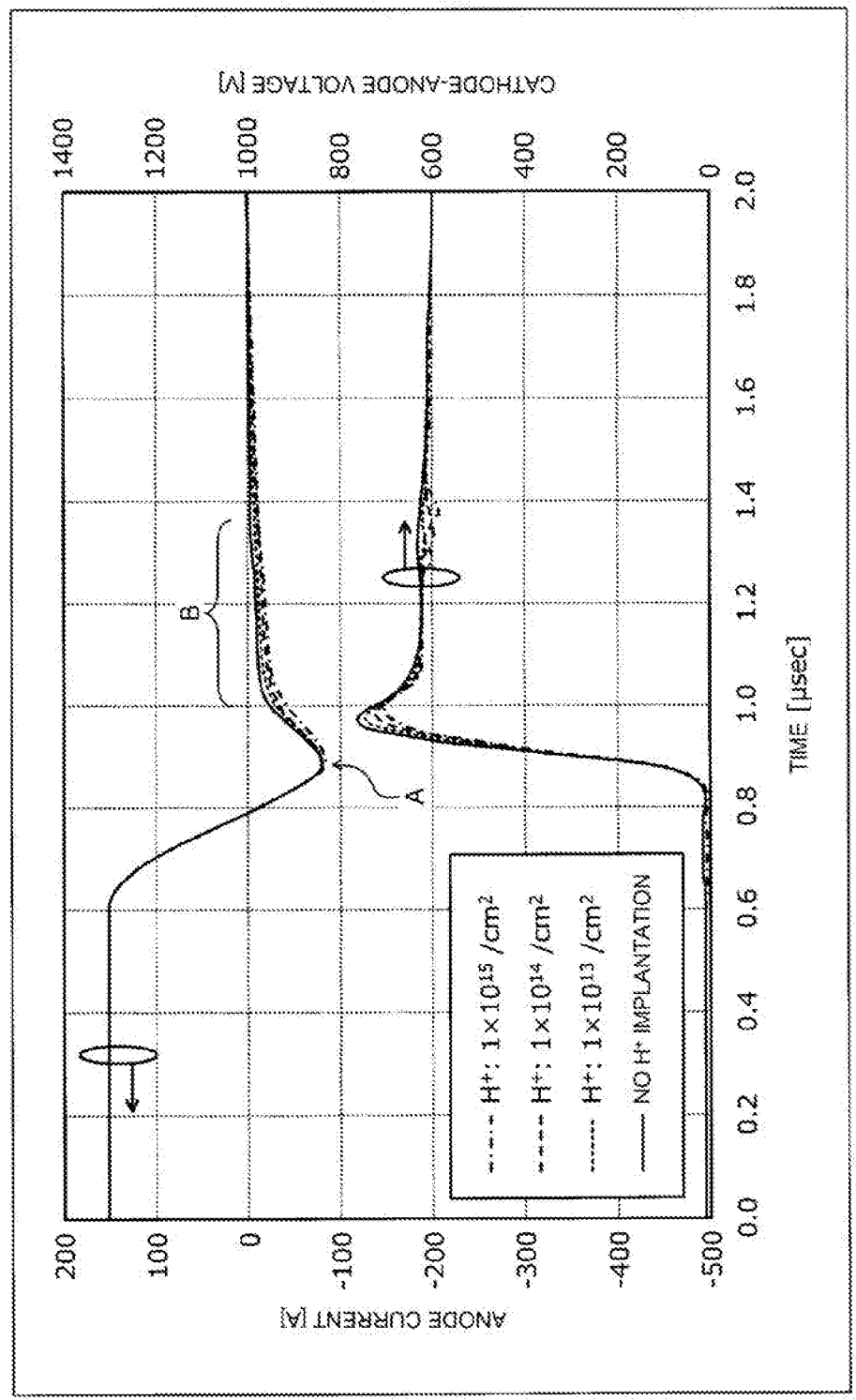
FIG. 10 is a characteristic diagram depicting the hydrogen dose dependency of the reverse recovery waveform of the semiconductor device according to Embodiment 1.

The ON voltage and the current/voltage waveform during reverse recovery of the semiconductor device according to Embodiment 1 will be described next. FIG. 9 is a characteristic diagram depicting the hydrogen dose dependency of the ON voltage of the semiconductor device according to Embodiment 1. FIG. 10 is a characteristic diagram depicting the hydrogen dose dependency of the reverse recovery waveform of the semiconductor device according to Embodiment 1. FIG. 9 shows the hydrogen dose dependency of the reverse recovery waveform when the n-type impurity ion implantation 13 and the hydrogen ion implantation 14 are executed separately by mass separation implantation. As shown in FIG. 9, the ON voltage Vf decreases as the hydrogen dose (H⁺ dose), implemented by the hydrogen ion implantation 14, increases. FIG. 9 shows the measured values when the hydrogen dose of the hydrogen ion implantation 14 is $1.0 \times 10^{12}/cm^2$ to $1.0 \times 10^{16}/cm^2$, but the ON voltage Vf still reduces as the hydrogen dose increases even when the hydrogen dose of the hydrogen ion implantation 14 is more than $1.0 \times 10^{16}/cm^2$. As shown in FIG. 10, the reverse recovery peak current Irp (peak value A of the anode current during reverse recovery), which is determined by the carrier concentration on the surface front surface side, is approximately the same value regardless the hydrogen dose of the hydrogen ion implantation 14. The tail current B of the reverse recovery current waveform (reverse recovery changes), on the other hand, increases as the hydrogen dose of the hydrogen ion implantation 14 increases, presenting a soft recovery. Therefore as the results in FIG. 9 and FIG. 10 show, the carrier lifetime on the cathode side of the n⁻-type drift layer 1 is recovered by the hydrogen ion implantation 14. As described above, the range of the hydrogen dose of the hydrogen ion implantation 14 is $1.0 \times 10^{12}/cm^2$ to $1.0 \times 10^{16}/cm^2$. Preferably the range is $1.0 \times 10^{13}/cm^2$ to $1.0 \times 10^{16}/cm^2$ where the ON voltage decreases. It is more preferable that the range is $1.0 \times 10^{14}/cm^2$ to $1.0 \times 10^{16}/cm^2$ where the ON voltage is sufficiently low, or $1.0 \times 10^{15}/cm^2$ to $1.0 \times 10^{16}/cm^2$ where the ON voltage further stabilizes.

The present inventors confirmed (not illustrated) that if the hydrogen implanted region 6 is formed by non-mass separation implantation using phosphine, such that the hydrogen dose of the hydrogen ion implantation 14 is within the above mentioned range, for example, then the ON voltage Vf can be 1.40 V or less, and the ON voltage Vf can be reduced to 1.38V by the mass separation implantation. The ON voltage Vf can be decreased by the non-mass separation implantation because the first and second concentration peaks 6-1 and 6-2 having concentration peaks at different depths from the substrate rear surface are generated, as mentioned above, and the width of the hydrogen implanted region 6 in the depth direction can be made wider than the case of generating only the concentration peak 6-3 of the hydrogen atoms, as in the case of mass separation implantation.

As described above, according to Embodiment 1, defects are formed throughout the n⁻-type semiconductor substrate by the electron beam irradiation, and then the defects on the substrate rear surface side are locally recovered by the hydrogen ion implantation from the substrate rear surface, whereby the carrier lifetime on the substrate rear surface side can be made longer than the carrier lifetime on the substrate front surface side. Hence, even if the carrier lifetime control is performed using the electron beam irradiation, the carrier lifetime can be locally controlled. Therefore the local carrier lifetime control can be performed at low cost without increasing the leak current or contaminating the manufacturing line. This means that the carrier lifetime on the cathode side (substrate rear surface side) of the n⁻-type drift layer can be made longer than the carrier lifetime on the anode side (substrate front surface side) of the n⁻-type drift layer, and the soft recovery characteristic of the diode can be improved. As a result, a diode, where oscillation of the current/voltage waveform during reverse recovery and surge due to oscillation of the voltage waveform are decreased, can be provide.

Embodiment 2

Figure 11:
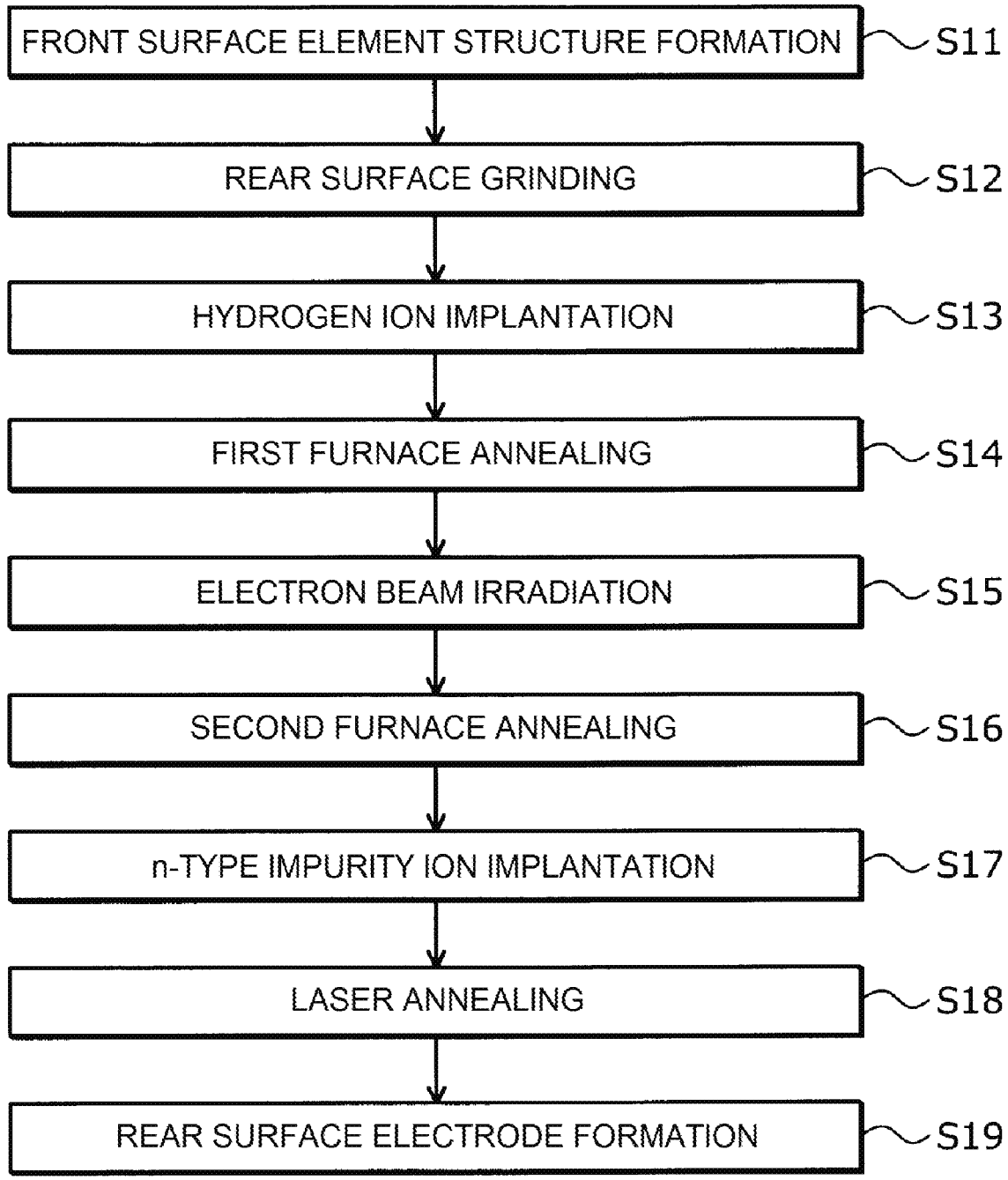
FIG. 11 is a flow chart depicting an overflow of a semiconductor device manufacturing method according to Embodiment 2.
Figure 12A:
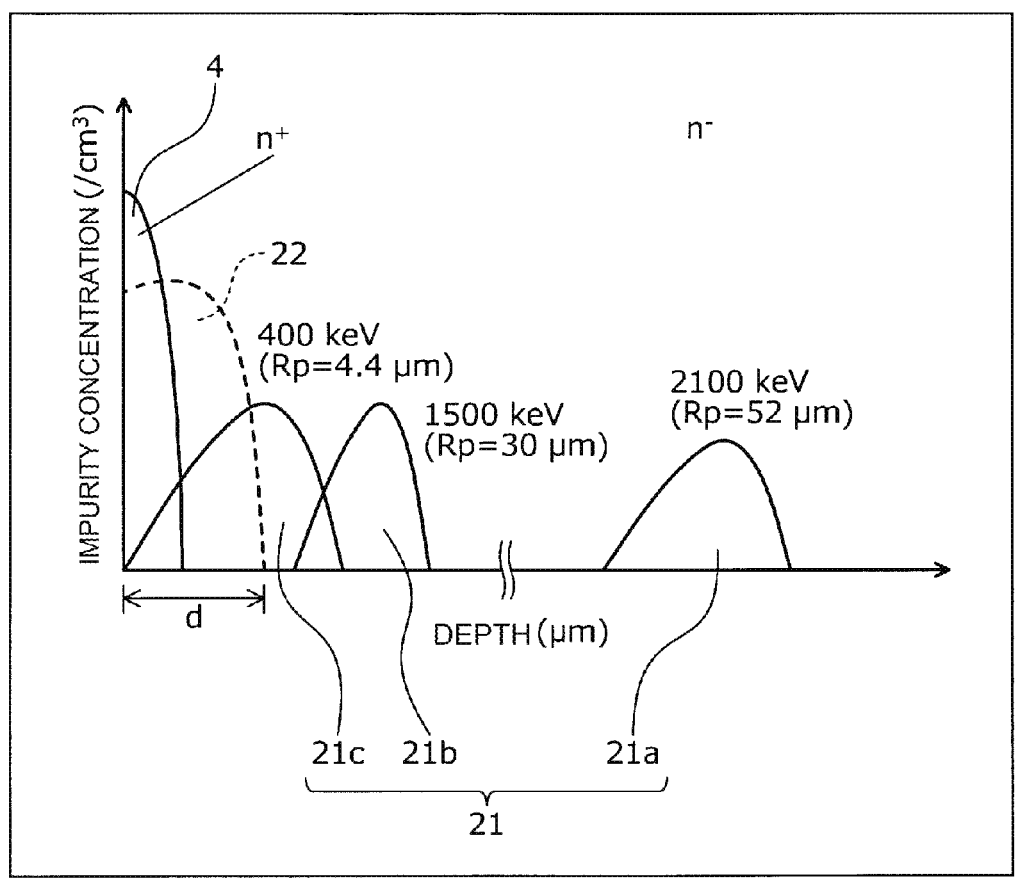
FIG. 12A is a characteristics diagram depicting the impurity concentration distribution of the semiconductor device according to Embodiment 2.
Figure 12B:
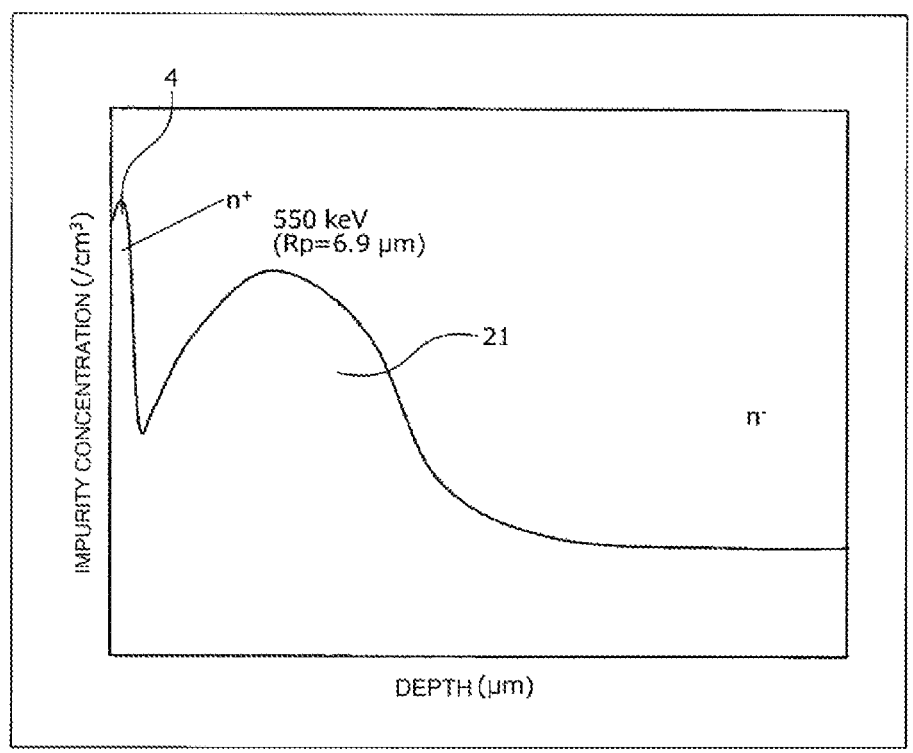
FIG. 12B is a characteristics diagram depicting the impurity concentration distribution of the semiconductor device according to Embodiment 2.

A semiconductor device manufacturing method according to Embodiment 2 will be described using an example of fabricating a pin diode, which includes an n-type field stop (FS) layer constituted by a hydrogen inducing donor, inside the n⁻-type drift layer. FIG. 11 is a flow chart depicting an overview of the semiconductor device manufacturing method according to Embodiment 2. FIG. 12A and FIG. 12B are characteristic diagrams depicting an impurity concentration distribution of the semiconductor device according to Embodiment 2. A difference of the semiconductor device manufacturing method according to Embodiment 2 from the semiconductor device manufacturing method according to Embodiment 1 is that the implantation depth of the hydrogen ion implantation from the substrate rear surface is made deeper than the penetration depth of the laser from the substrate rear surface in the laser annealing for activating the n⁺-type cathode layer 4.

First, a front surface element structure is formed on the front surface side of the n⁻-type semiconductor substrate to be the n⁻-type drift layer in the same manner as Embodiment 1 (step S11). Then the n⁻-type semiconductor substrate is ground from the rear surface side until reaching a position at which thickness of the semiconductor device as a product is implemented (step S12). The method for grinding the rear surface of the n⁻-type semiconductor substrate is the same as Embodiment 1. Then hydrogen ions are implanted from the rear surface side of the n⁻-type semiconductor substrate, and hydrogen is implanted into a region for forming the n-type field stop (FS) layer 21 inside the n⁻type drift layer (step S13). In step S13, the n-type FS layers 21a to 21c, of which depths from the substrate rear surface are different, are formed, hence the hydrogen ion implantation may be performed a plurality of times while changing the acceleration energy in various ways.

The hydrogen ion implantation in step S13 is proton implantation, for example, and is performed at a higher acceleration energy than the hydrogen ion implantation of Embodiment 1. In other words, in step S13, the implantation depth of the hydrogen ion implantation (that is, the range Rp of the hydrogen ion implantation) is deeper than the penetration depth of the laser which is irradiated from the substrate rear surface in the later mentioned laser annealing step for activating the n⁺-cathode layer. The dose of the hydrogen ion implantation is $1 \times 10^{13}/cm^2$ or more, $1 \times 10^{15}/cm^2$ or less, for example, and is preferably $1 \times 10^{14}/cm^2$ or more. The acceleration energy of the hydrogen ion implantation is 500 keV or more, for example, preferably 1 MeV or more, 3 MeV or less. The hydrogen ion implantation may be executed a plurality of times at a 500 keV or less low acceleration energy, for example.

For the hydrogen ion implantation, the high acceleration energy (1 MeV to 3 MeV) and the low acceleration energy (less than 1 MeV, preferably 500 keV or less) may be combined for a plurality of times. In this case, for the hydrogen ion implantation, the acceleration energy of the ion implantation, to form the n-type FS layer 21c which is shallowest from the substrate rear surface, is set to 500 keV or less, for example. In concrete terms, the acceleration energy of each hydrogen ion implantation that is performed by combining the high acceleration energy and the low acceleration energy a plurality of times may be 400 keV, 800 keV, 1100 keV and (1500 keV), for example, or may be 400 keV, 1500 keV and 2100 keV. The dose of each hydrogen ion implantation at this time is not especially limited, and may be a dose that implements the impurity concentration required for each n-type FS layer 21, such as $3 \times 10^{14}/cm^2$, $1 \times 10^{13}/cm^2$, $1 \times 10^{13}/cm^2$ and ($1 \times 10^{13}/cm^2$), for example.

FIG. 12A shows the impurity concentration distribution of the n-type FS layers 21a to 21c formed by performing the hydrogen ion implantation a plurality of times. The acceleration energy of each hydrogen ion implantation, to form the n-type FS layers 21a to 21c, is 2100 keV, 1500 keV and 400 keV respectively. In this case, the ranges of the n-type FS layers 21a to 21c are 52 μm, 30 μm and 4.4 μm respectively. FIG. 12B shows the impurity concentration distribution of the n-type FS layer 21 formed by hydrogen ion implantation performed once. The acceleration energy of the hydrogen ion implantation for forming the n-type FS layer 21 is 550 keV. In this case, the range of the n-type FS layer 21 is 6.9 μm.

Then the furnace annealing for ionizing hydrogen atoms introduced to the n⁻-type semiconductor substrate and generating a hydrogen induced donor (hereafter called "first furnace annealing") is performed (step S14). The temperature of the first furnace annealing is higher than the temperature of the second furnace annealing after the electron beam irradiation, which is performed later, and is preferably 300° C. or more, 500° C. or less, for example, such as 380° C. or more, 400° C. or less in concrete terms. This temperature may be 330° C. or more, 350° C. or less. The first furnace annealing processing time may be 30 minutes or more, 10 hours or less, for example. In concrete terms, the first furnace annealing is performed at about a 350° C. temperature for about one hour. By the first furnace annealing, the generation of a hydrogen induced donor is accelerated, and a donor layer, which has a concentration peak higher than the carrier concentration of the n⁻-type semiconductor substrate, is formed inside the n⁻-type drift layer. This donor layer is the n-type FS layer 21. Further, by the hydrogen ion implantation at a high acceleration energy and the first furnace annealing, a hydrogen implanted region 22 having a hydrogen concentration equal to or higher than the hydrogen concentration of the bulk substrate is formed in a region shallower than the n-type FS layer 21 from the substrate rear surface (on the cathode side of the n⁻-type semiconductor substrate), in the same manner as in Embodiment 1. This hydrogen implanted region 22 may be a donor layer.

Then the electron beam irradiation and the furnace annealing (hereafter called "second furnace annealing") are performed (steps S15 and S16), in the same manner as in Embodiment 1, so as to generate the defects 12 throughout the n⁻-type semiconductor substrate. In this case, the hydrogen implanted region 22 has been formed on the cathode side of the n⁻-type semiconductor substrate, hence a number of defects 12 of the n⁻-type semiconductor substrate is less in the cathode side than in the anode side. Then in the same manner as in Embodiment 1, the n⁺-type cathode layer 4 is formed by performing the n-type impurity ion implantation (step S17) and the laser annealing (step S18), and then the rear surface electrode is formed (step S19), whereby the pin diode, including the n-type FS layer 21 constituted by the hydrogen induced donor, is completed.

If the hydrogen ion implantation in step S13 is performed a plurality of times, combining the high acceleration energy and the low acceleration energy, or if the hydrogen ion implantation in step S13 is performed a plurality of times using low acceleration energy, the hydrogen concentration at a shallow depth, such as 3 μm from the substrate rear surface, can be the bulk substrate concentration or more with certainty by the hydrogen ion implantation at low acceleration energy.

As described above, according to Embodiment 2, the hydrogen implanted region is formed in a portion to provide a long carrier lifetime on the substrate rear side, even if the hydrogen ion implantation is performed targeting a region deeper than the portion to provide a long carrier lifetime on the substrate rear side, hence an effect similar to Embodiment 1 can be implemented.

Embodiment 3

A semiconductor device manufacturing method according to Embodiment 3 will be described next. FIG. 13 is a flow chart depicting an overview of the semiconductor device manufacturing method according to Embodiment 3. A difference of the semiconductor device manufacturing method according to Embodiment 3 from the semiconductor device manufacturing method according to Embodiment 1 is that the electron beam irradiation and the furnace annealing are performed after the laser annealing. The semiconductor device manufacturing method according to Embodiment 3 is useful when defects are formed in a shallow region, such as 3 μm or less from the substrate rear side, by the hydrogen ion implantation (e.g. a case of fabricating a pin diode which does not include an FS layer).

In concrete terms, in the same manner as in Embodiment 1, the front surface element structure is formed (step S21). Then the rear surface grinding (step S22), the hydrogen ion implantation (step S23), the n-type impurity ion implantation (step S24), the laser annealing (step S25), the electron beam irradiation (step S26), the furnace annealing (step S27), and the rear surface electrode formation (step S28) are sequentially performed, where a pin diode is completed. In step S23, the hydrogen ion implantation may be performed a plurality of times, in the same manner as in Embodiment 1. The conditions of the rear surface grinding, the hydrogen ion implantation, the n-type impurity ion implantation, the laser annealing, the electron beam irradiation, the furnace annealing, and the rear surface electrode formation are the same as Embodiment 1.

As mentioned above, the electron beam irradiation and the furnace annealing are performed after the laser annealing. Therefore the carrier lifetime distribution adjusted by the electron beam irradiation and furnace annealing based on the impurity concentration distribution of the hydrogen implanted region is not influenced by the dispersion of the laser annealing. Hence a change in the desired carrier lifetime distribution obtained by the hydrogen ion implantation and electron beam irradiation can be prevented.

As described above, according to Embodiment 3, an effect similar to Embodiment 1 can be implemented.

Embodiment 4

Figure 14:
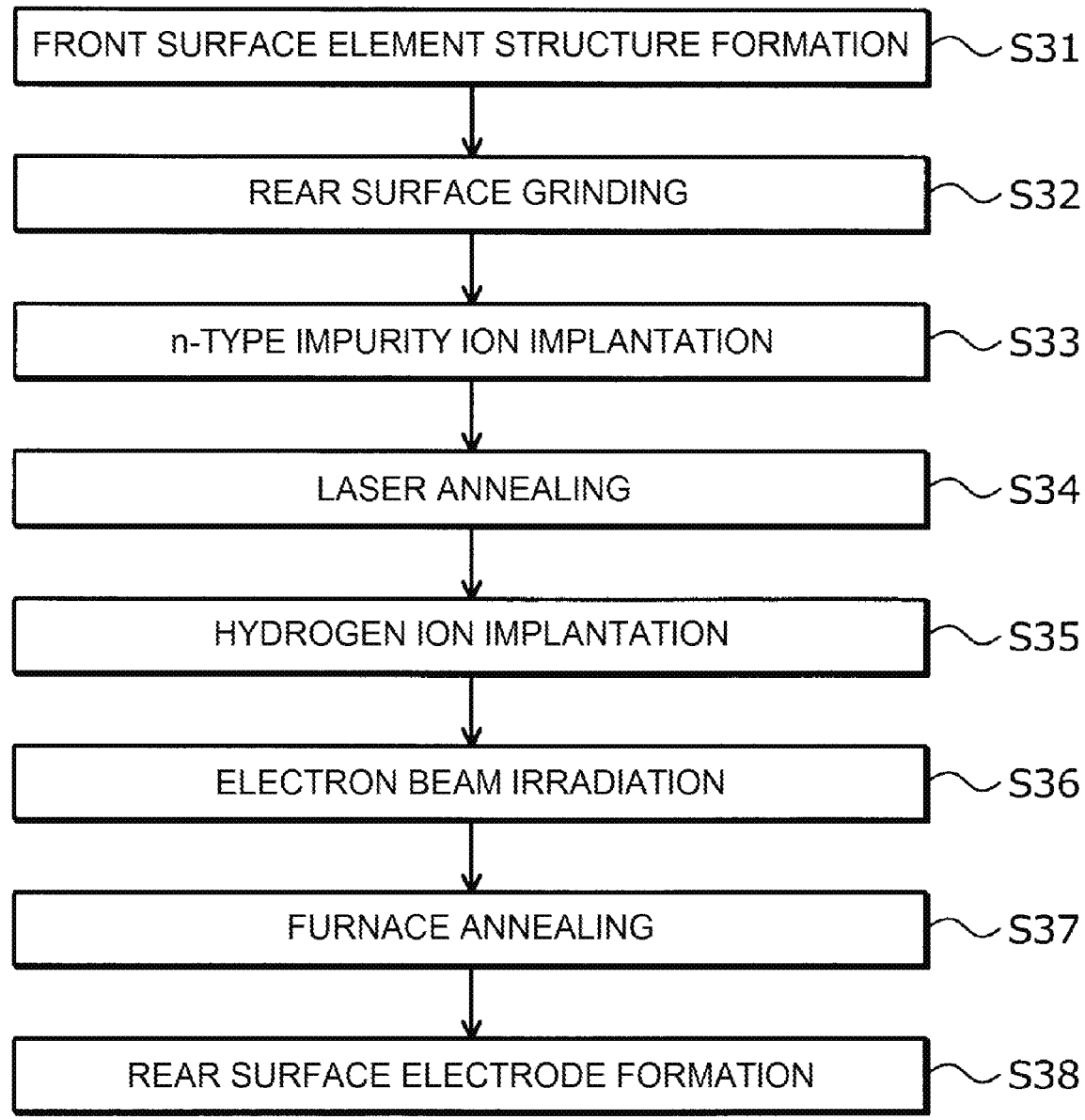
FIG. 14 is a flow chart depicting an overview of a semiconductor device manufacturing method according to Embodiment 4.

A semiconductor device manufacturing method according to Embodiment 4 will be described next. FIG. 14 is a flow chart depicting an overview of the semiconductor device manufacturing method according to Embodiment 4. A difference of the semiconductor device manufacturing method according to Embodiment 4 from the semiconductor device manufacturing method according to Embodiment 3 is that the hydrogen ion implantation is performed after the laser annealing and before the electron beam irradiation.

In concrete terms, in the same manner as in Embodiment 3, the front surface element structure is formed and the rear surface is ground sequentially (steps S31, S32). Then the n-type impurity ion implantation (step S33), the laser annealing (step S34), the hydrogen ion implantation (step S35), the electron beam irradiation (step S36), the furnace annealing (step S37) and the rear surface electrode formation (step S38) are sequentially performed, whereby the pin diode is completed. Conditions of the n-type impurity ion implantation, the laser annealing, the hydrogen ion implantation, the electron beam irradiation, the furnace annealing and the rear surface electrode formation are the same as Embodiment 3.

In the laser annealing, the irradiation surface on the semiconductor substrate, where the laser is irradiated, may in some cases melt. If the hydrogen ion implantation is performed before the laser annealing in such a case, the implanted hydrogen may be emitted outside the substrate surface because of the melting of the substrate irradiation surface by the laser irradiation, and the hydrogen termination effect may be decreased. If the hydrogen ion implantation is performed after the laser annealing, as in Embodiment 4, emission of hydrogen outside the substrate surface, can be prevented, and a decrease in the hydrogen termination effect can be controlled.

As described above, according to Embodiment 4, an effect similar to Embodiment 3 can be implemented.

Embodiment 5

Figure 15:
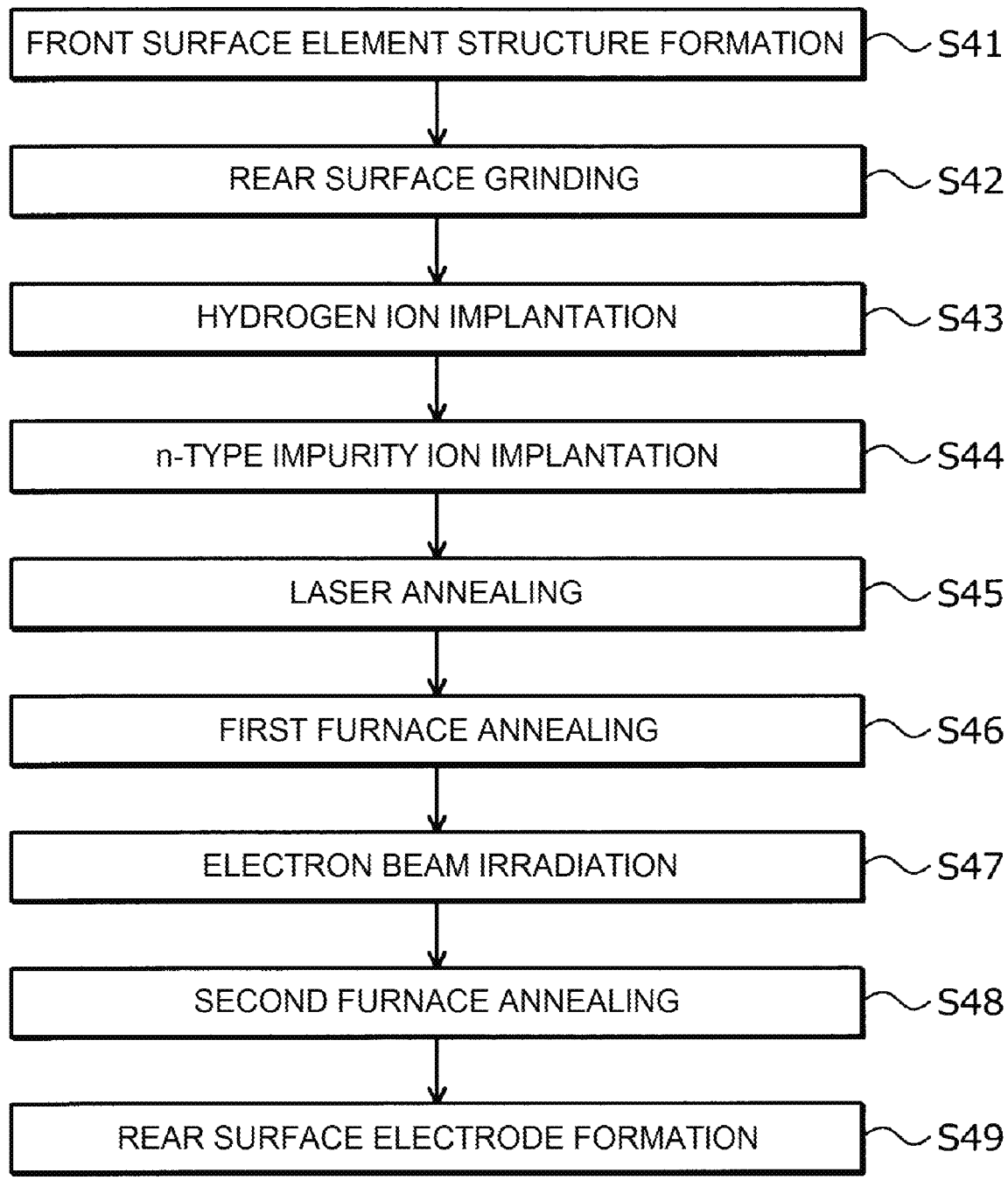
FIG. 15 is a flow chart depicting an overview of a semiconductor device manufacturing method according to Embodiment 5.

A semiconductor device manufacturing method according to Embodiment 5 will be described next. FIG. 15 is a flow chart depicting an overview of the semiconductor device manufacturing method according to Embodiment 5. A difference of the semiconductor device manufacturing method according to Embodiment 5 from the semiconductor device manufacturing method according to Embodiment 3 is that first furnace annealing for activating impurities is performed after the laser annealing and before the electron beam irradiation. The semiconductor device manufacturing method according to Embodiment 5 is useful when protons, for example, implanted in the deeper region from the substrate rear surface, are activated (e.g. in the case of fabricating a pin diode including a plurality of stages of FS layers).

In concrete terms, in the same manner as in Embodiment 3, the front surface element structure formation (step S41), the rear surface grinding (step S42), the hydrogen ion implantation (step S43), the n-type impurity ion implantation (step S44) and the laser annealing (step S45) are sequentially performed. In step S43, in the same manner as in Embodiment 2, hydrogen is implanted into the region to form the n-type FS layer disposed in a deep region which is 3 μm or more, particularly 10 μm or more, from the substrate rear surface, for example, by a plurality of times of hydrogen ion implantation, and a hydrogen implanted region is formed in a region shallower than the n-type FS layer from the substrate rear surface. Then the furnace annealing for activating the impurities (first furnace annealing) is performed (step S46). The conditions of the first furnace annealing may be the same as the first furnace annealing of Embodiment 2, for example. By this first furnace annealing, protons implanted into a position deeper from the substrate rear surface are activated, and a plurality of stages of n-type FS layers are formed, for example. Then in the same manner as in Embodiment 3, the electron beam irradiation (step S47), furnace annealing for forming defects (second furnace annealing) (step S48), and rear surface electrode formation (step S49) are sequentially performed, whereby the pin diode is completed.

As described above, according to Embodiment 5, an effect similar to Embodiments 1 to 4 can be implemented.

Embodiment 6

Figure 16:
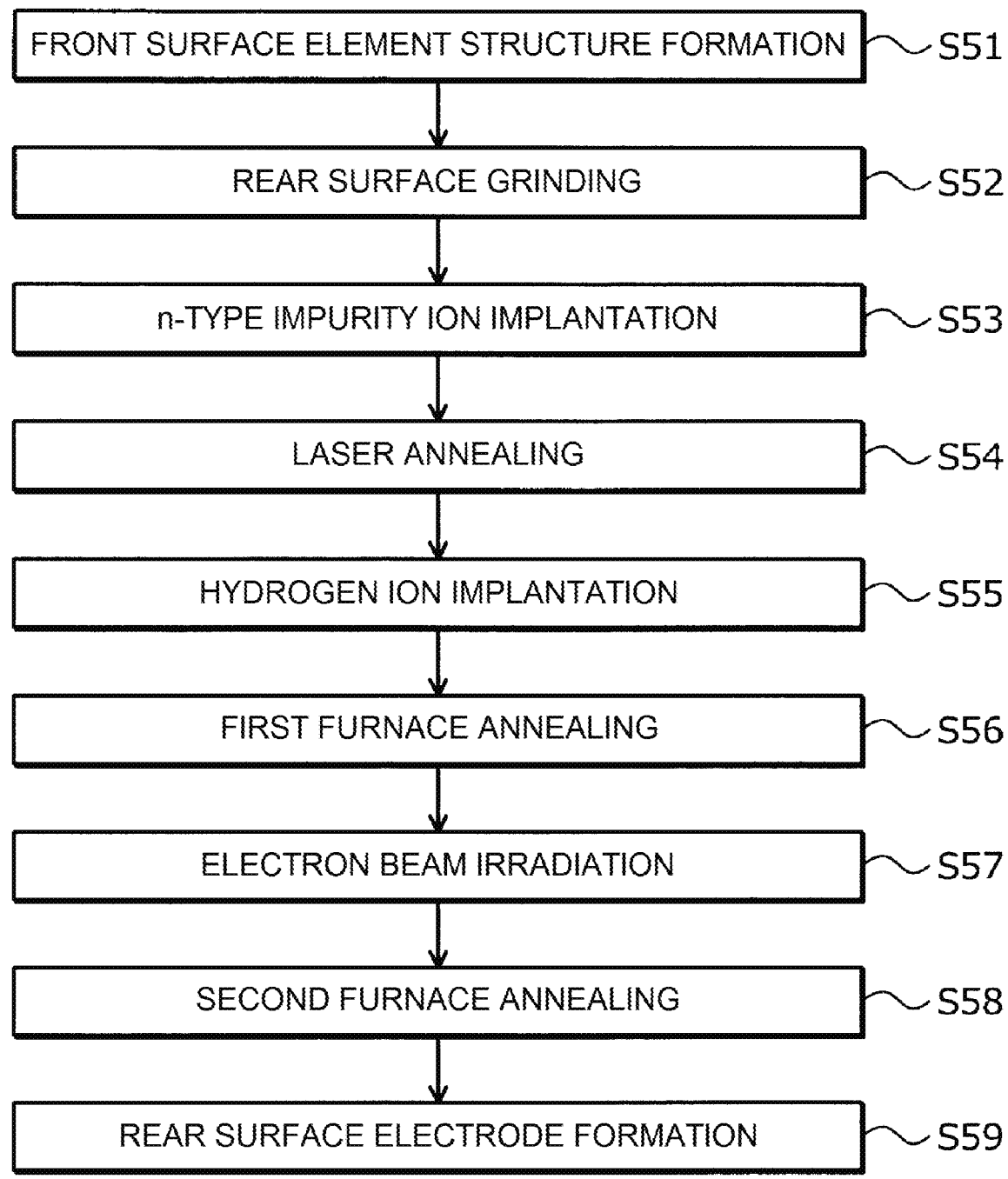
FIG. 16 is a flow chart depicting an overview of a semiconductor device manufacturing method according to Embodiment 6.

A semiconductor device manufacturing method according to Embodiment 6 will be described next. FIG. 16 is a flow chart depicting an overview of the semiconductor device manufacturing method according to Embodiment 6. A difference of the semiconductor device manufacturing method according to Embodiment 6 from the semiconductor device manufacturing method according to Embodiment 5 is that the hydrogen ion implantation is performed after the laser annealing and before the first furnace annealing.

In concrete terms, in the same manner as in Embodiment 5, the front surface element structure is formed and the rear surface is ground sequentially (steps S51, S52). Then the n-type impurity ion implantation (step S53), the laser annealing (step S54), the hydrogen ion implantation (step S55), the first furnace annealing (step S56), the electron beam irradiation (step S57), the second furnace annealing (step S58) and the rear surface electrode formation (step S59) are sequentially performed, whereby the pin diode is completed. Conditions of the n-type impurity ion implantation, the laser annealing, hydrogen ion implantation, the first furnace annealing, the electron beam irradiation, the second furnace annealing and the rear surface electrode formation are the same as Embodiment 5.

As described above, according to Embodiment 6, an effect similar to Embodiments 4 and 5 can be implemented.

Embodiment 7

Figure 17:
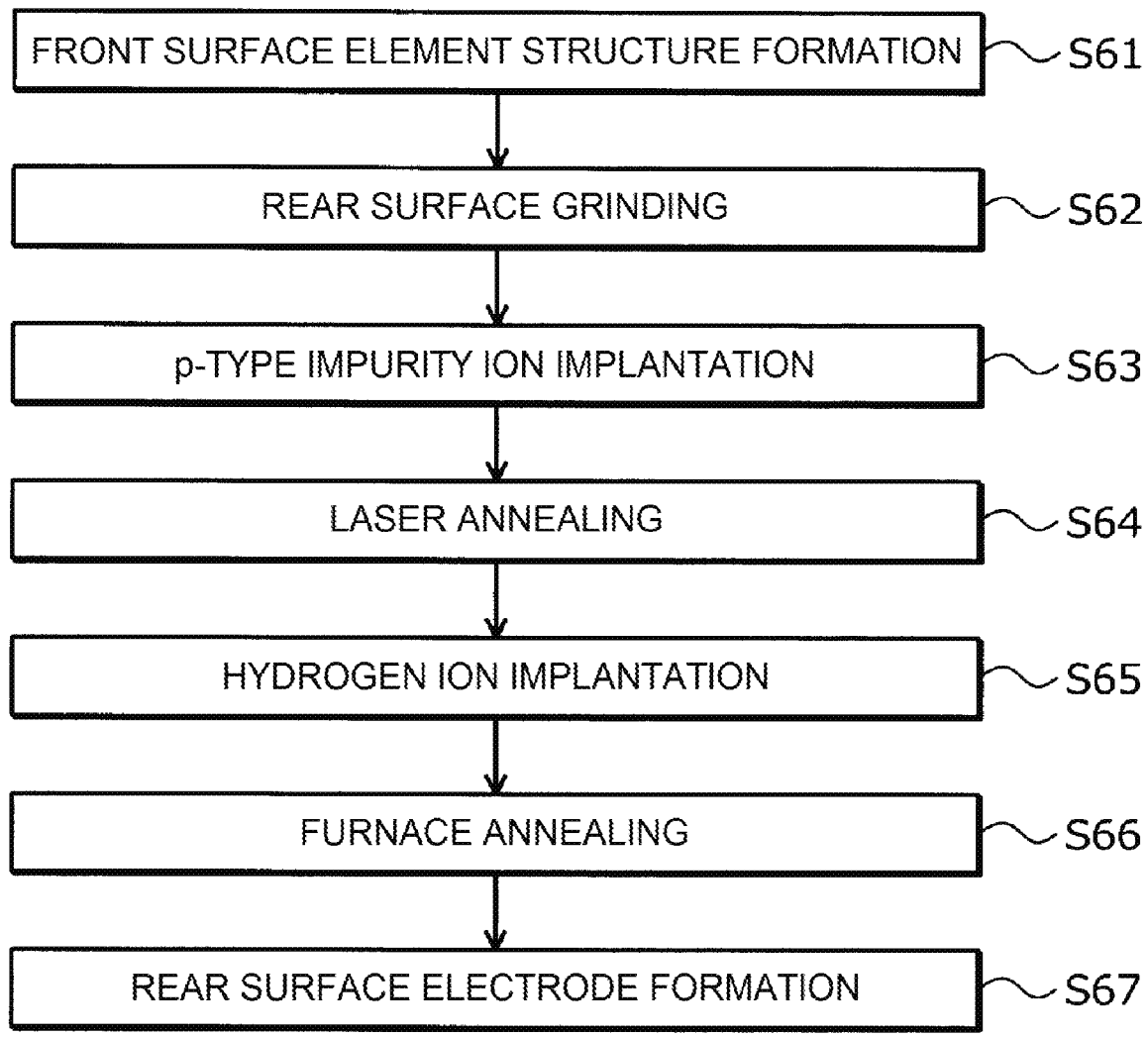
FIG. 17 is a flow chart depicting an overview of a semiconductor device manufacturing method according to Embodiment 7.

A semiconductor device manufacturing method according to Embodiment 7 will be described next. FIG. 17 is a flow chart depicting an overview of the semiconductor device manufacturing method according to Embodiment 7. FIG. 18 to FIG. 24 are cross-sectional views depicting each state during manufacturing the semiconductor device according to Embodiment 7. The semiconductor device manufacturing method according to Embodiment 7 is a method of fabricating an IGBT having an n-type FS layer in a deep region from the substrate rear surface (e.g. see FIG. 24) by applying Embodiment 2. In the case of fabricating an IGBT as well, the hydrogen implanted region can be formed in a region shallower than the n-type FS layer 40 from the substrate rear surface, by the hydrogen ion implantation 54 that implants hydrogen into the region to form the n-type FS layer 40, and carrier lifetime can be adjusted, in the same manner as in Embodiment 2. The semiconductor device manufacturing method according to Embodiment 7 is useful when the n-type FS layer 40 is formed in a deep region from the substrate rear surface where impurities cannot be introduced by ion implantation of elements, such as phosphorus and arsenic, of which ranges are shorter than hydrogen.

Figure 18:
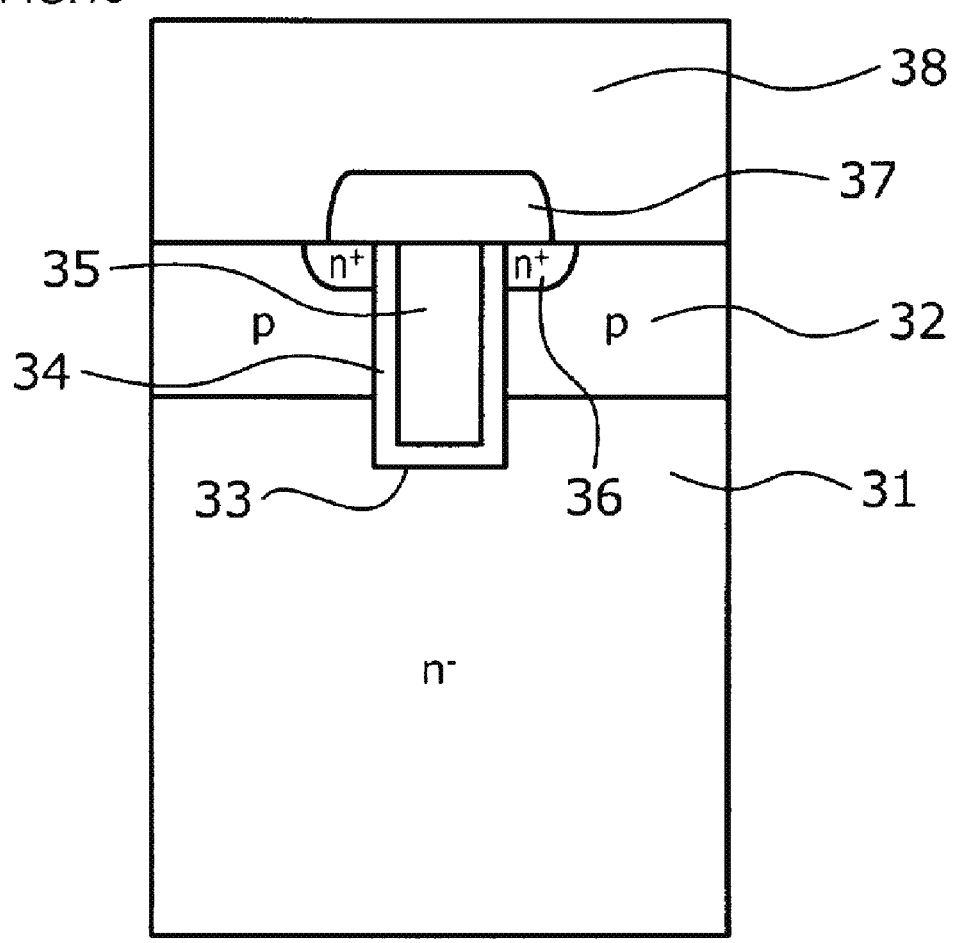
FIG. 18 is a cross-sectional view depicting a state during manufacturing the semiconductor device according to Embodiment 7.
Figure 19:
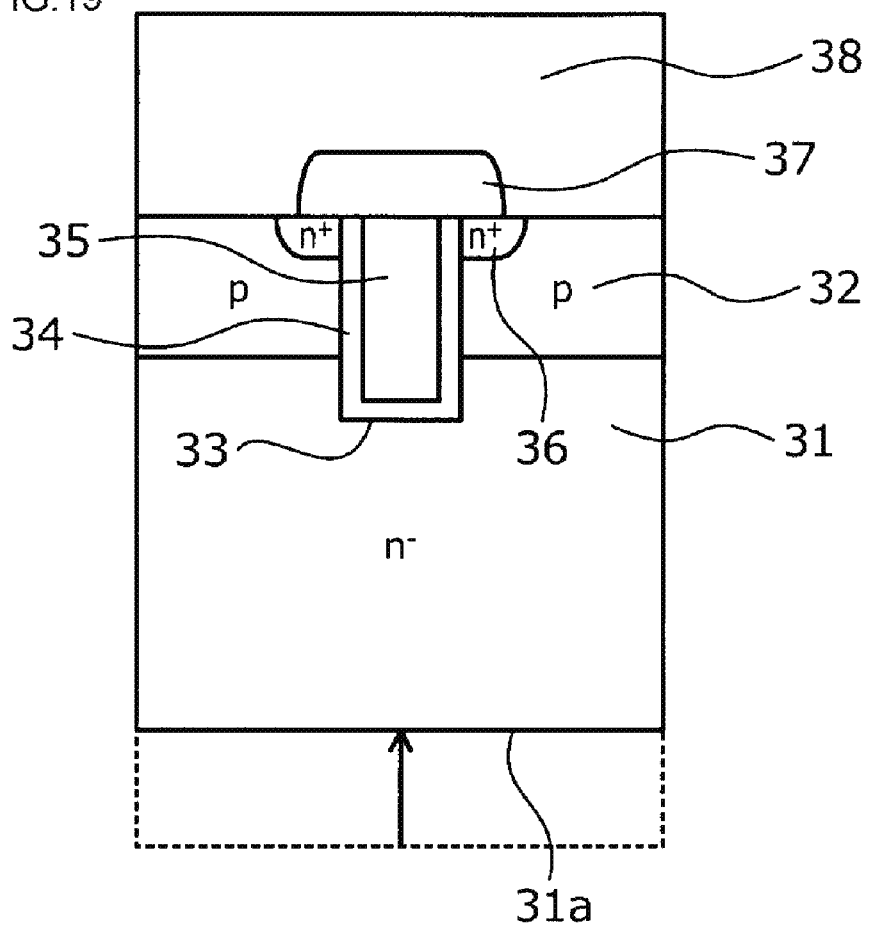
FIG. 19 is a cross-sectional view depicting a state during manufacturing the semiconductor device according to Embodiment 7.

In concrete terms, as illustrated in FIG. 18, a standard MOS gate (Metal-Oxide film-Semiconductor insulation gate) structure and a front surface element structure constituted by, an emitter electrode 38, a termination withstand voltage structure (not illustrated), a passivation film (not illustrated) or the like are formed (step S61) on the front surface side of the n$^-$-type semiconductor substrate, which becomes an n$^-$-type drift layer 31. The MOS gate structure is constituted by a p-type base layer 32, a trench 33, a gate insulation film 34, a gate electrode 35 and an n$^+$-type emitter region 36. The reference numeral 37 denotes an inter-layer insulation film. Then as illustrated in FIG. 19, the n$^-$-type semiconductor substrate is ground from the rear surface side until reaching a position 31a at which actual thickness of the semiconductor device as a product is implemented (step S62).

Figure 20:
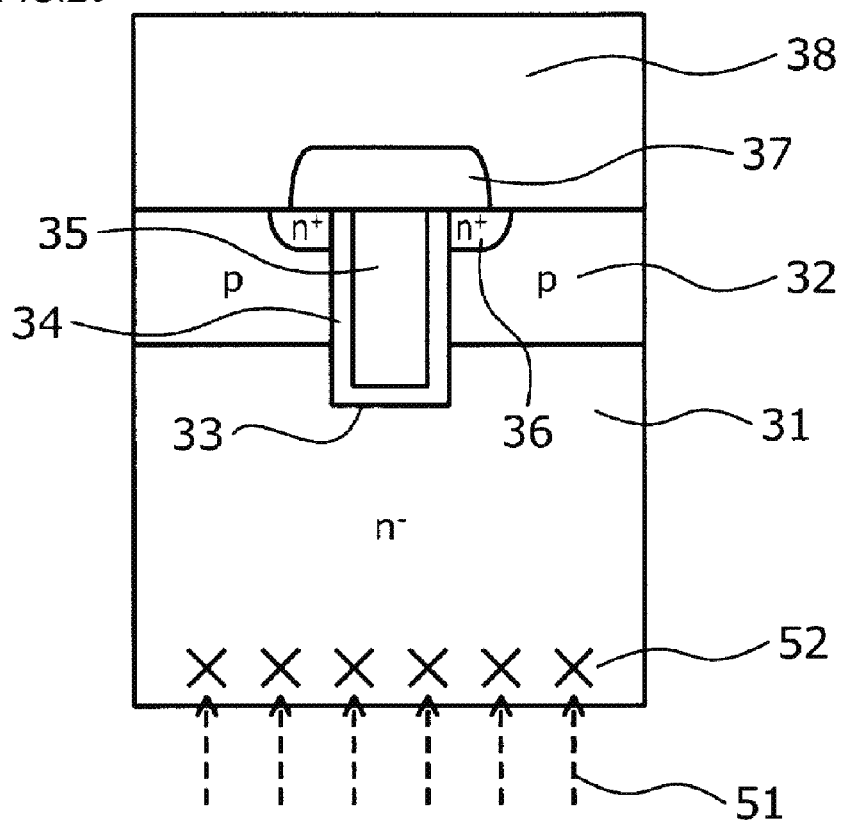
FIG. 20 is a cross-sectional view depicting a state during manufacturing the semiconductor device according to Embodiment 7.
Figure 21:
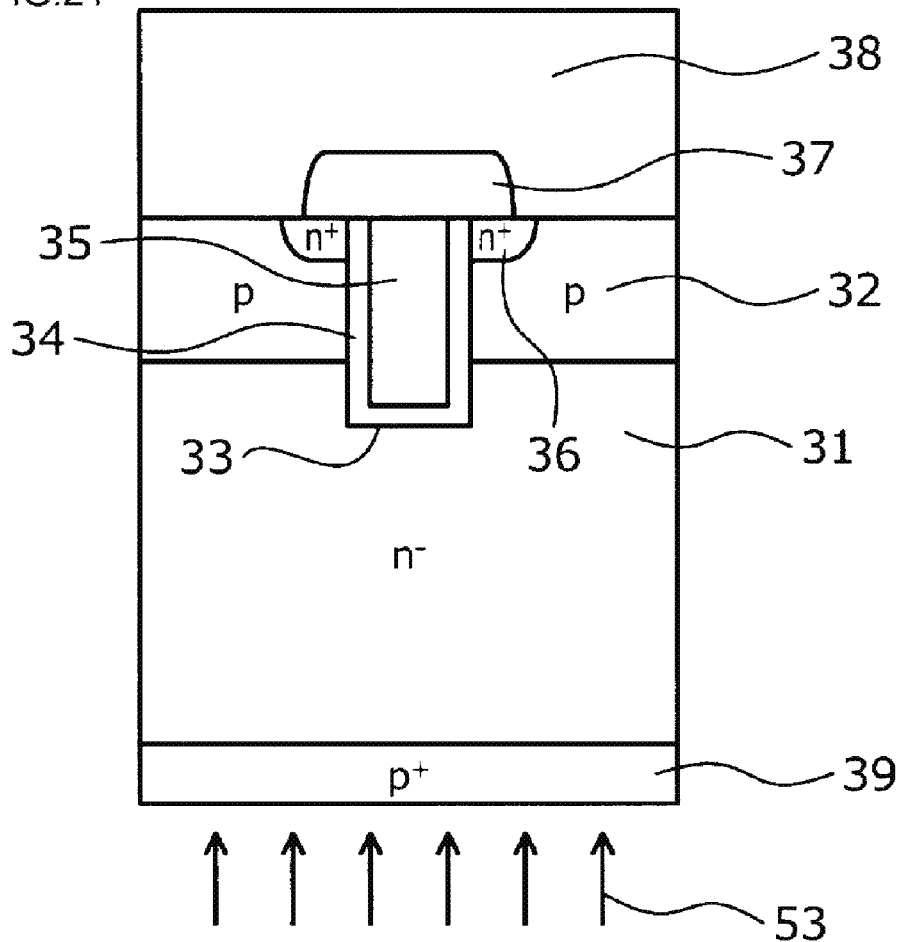
FIG. 21 is a cross-sectional view depicting a state during manufacturing the semiconductor device according to Embodiment 7.

Then as illustrated in FIG. 20, p-type impurities, such as boron (B), are ion-implanted (hereafter called "p-type impurity ion implantation 51": second implantation step) from the ground rear surface side of the n$^-$-type semiconductor substrate, and the p-type impurities 52 are introduced into the region to form the p$^+$-type collector layer 39 (step S63). In FIG. 20, × indicates the p-type impurities 52 introduced into the region to form the p$^+$-type collector layer 39. Then as illustrated in FIG. 21, the p-type impurities 52 implanted on the rear surface side of the n$^-$-type semiconductor substrate are activated by the laser annealing 53 (step S64). Thereby the p$^+$-type collector layer 39 is formed on the surface layer of the rear surface of the n$^-$-type semiconductor substrate.

Figure 22:
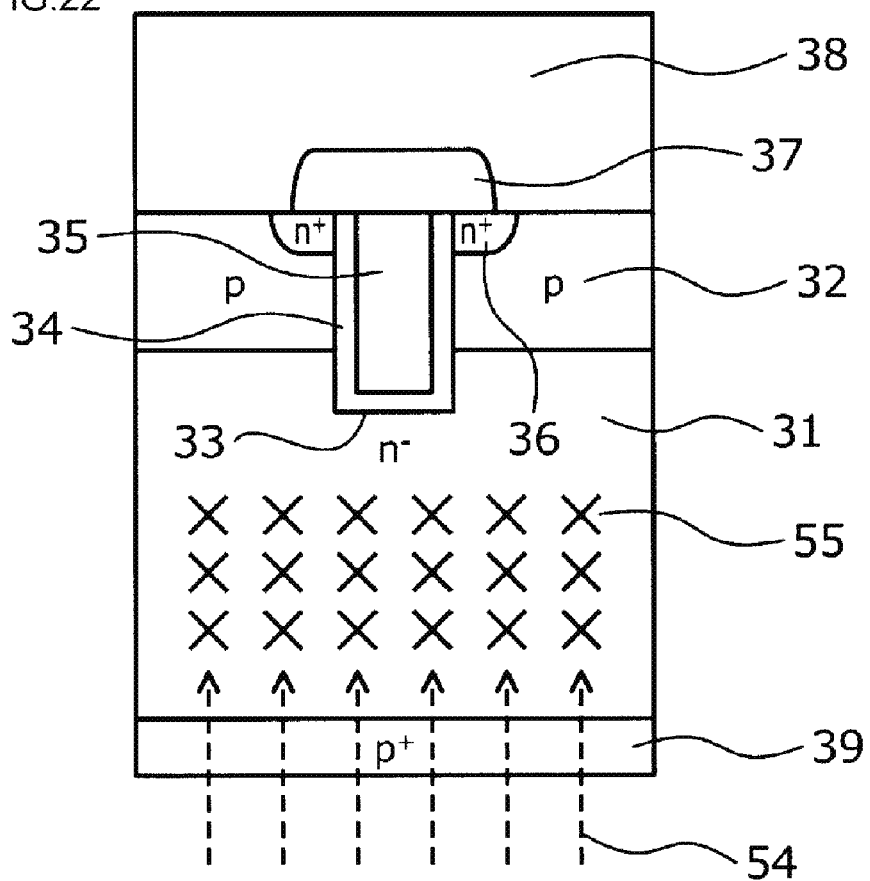
FIG. 22 is a cross-sectional view depicting a state during manufacturing the semiconductor device according to Embodiment 7.

Then as illustrated in FIG. 22, the hydrogen ion implantation 54 is performed from the ground rear surface side of the n$^-$-type semiconductor substrate, and hydrogen is implanted into the region to form the n-type FS layer 40 inside the n$^-$-type drift layer 31 (step S65). For the hydrogen ion implantation in step S65, proton implantation is performed, for example, in the same manner as in Embodiment 2. In step S65, a plurality of n-type FS layers 40, of which depths from the substrate rear surface are different, are formed, hence the hydrogen ion implantation may be performed a plurality of times, while changing the acceleration energy in various ways. By this hydrogen ion implantation 54, the hydrogen implanted region is formed in a shallower region from the substrate rear surface than the n-type FS layer 40. In FIG. 22, × indicates a defect 55.

Figure 23:
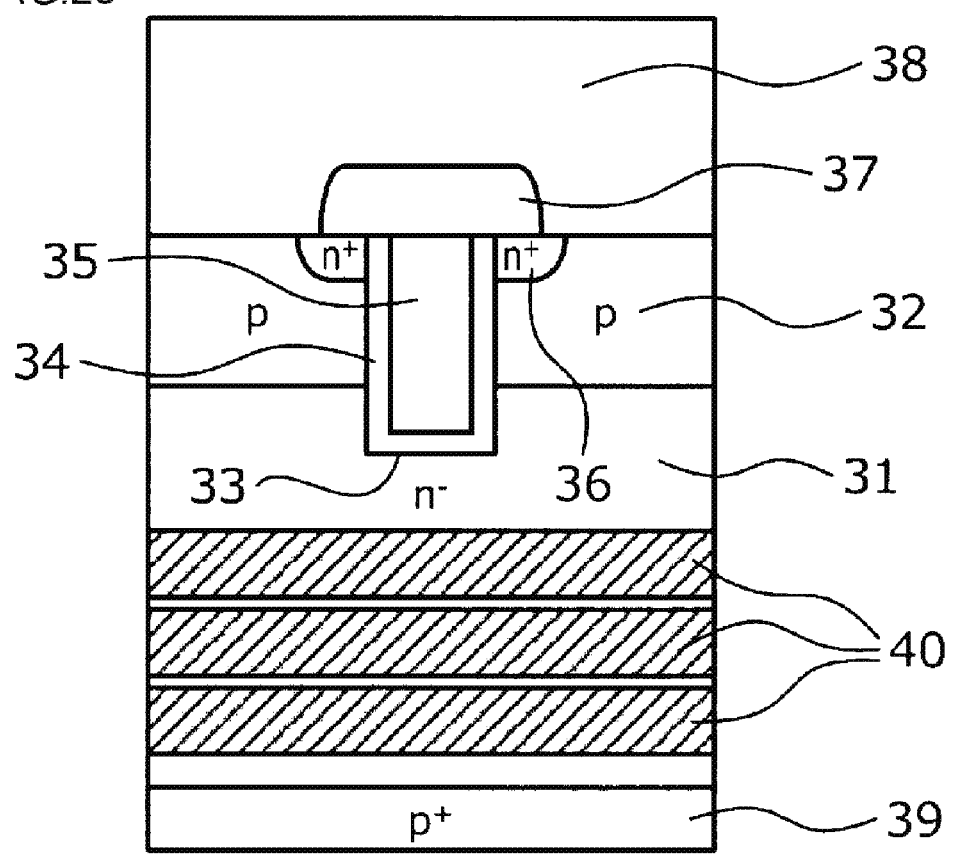
FIG. 23 is a cross-sectional view depicting a state during manufacturing the semiconductor device according to Embodiment 7.
Figure 24:
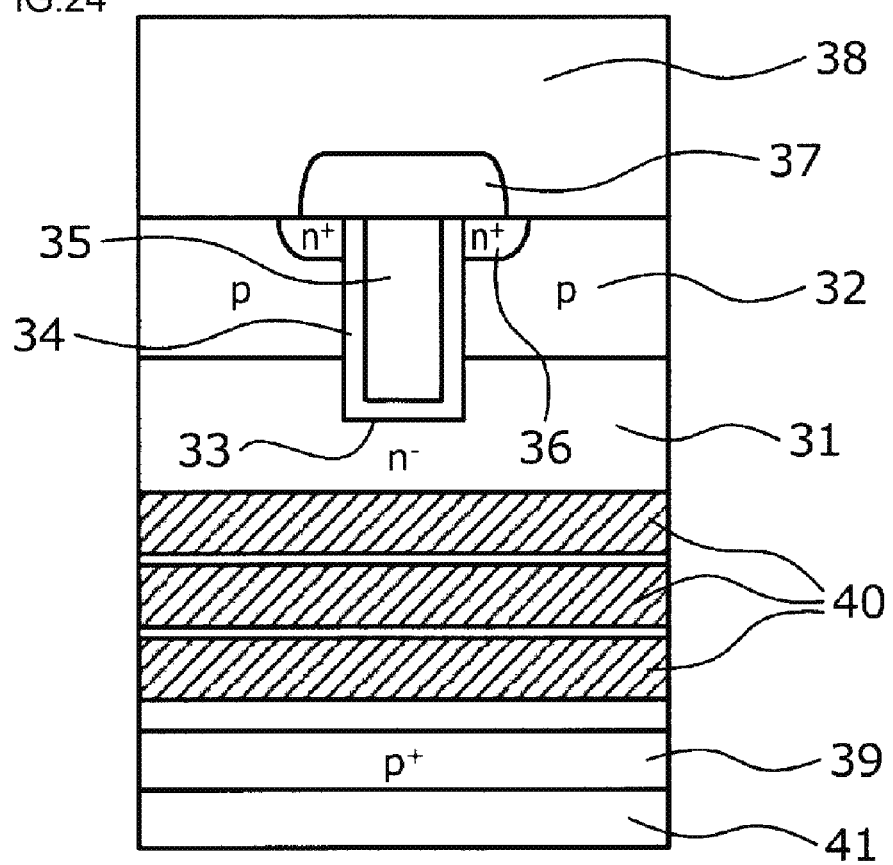
FIG. 24 is a cross-sectional view depicting a state during manufacturing the semiconductor device according to Embodiment 7.

Then as illustrated in FIG. 23, the furnace annealing for ionizing hydrogen atoms and generating a hydrogen induced donor is performed, whereby the hydrogen induced donor generation of the hydrogen atoms inside the hydrogen implanted region is accelerated, and a donor layer to be the n-type FS layer 40 is formed (step S66). The conditions of the furnace annealing in step S66 may be the same as the first furnace annealing of Embodiment 2, for example. Then as illustrated in FIG. 24, the collector electrode 41, which contacts the p$^+$-type collector layer 39, is formed as the rear surface electrode on the rear surface of the n$^-$-type semiconductor substrate (step S67), whereby the IGBT, including the n-type FS layer 40 constituted by the hydrogen induced donor, is completed.

If the p$^+$-type collector layer 39 is formed by the boron ion implantation, lattice defects, such as vacancy and divacancy, remain on the p$^+$-type collector layer 39 and the semiconductor substrate in the vicinity thereof. If the hydrogen ions are implanted after the p$^+$-type collector layer 39 is formed, the hydrogen terminates the dangling bonds due to the remaining lattice defects. Thereby the lifetime in the p$^+$-type collector layer 39 increases, and hole implantation efficiency can be increased. As a result, the ON voltage of the IGBT can be decreased.

As mentioned above, the hydrogen ion implantation 54 and furnace annealing for forming the n-type FS layer 40 are performed after the laser annealing to activate the p$^+$-type collector layer 39. Therefore the n-type FS layer 40 is not influenced by the dispersion of laser annealing 53. Hence a change in the desire impurity concentration distribution and diffusion depth of the n-type FS layer 40, obtained by the hydrogen ion implantation 54 and furnace annealing, can be prevented.

As described above, according to Embodiment 7, an effect similar to Embodiment 1 to 6 can be implemented.

Embodiment 8

Figure 25:
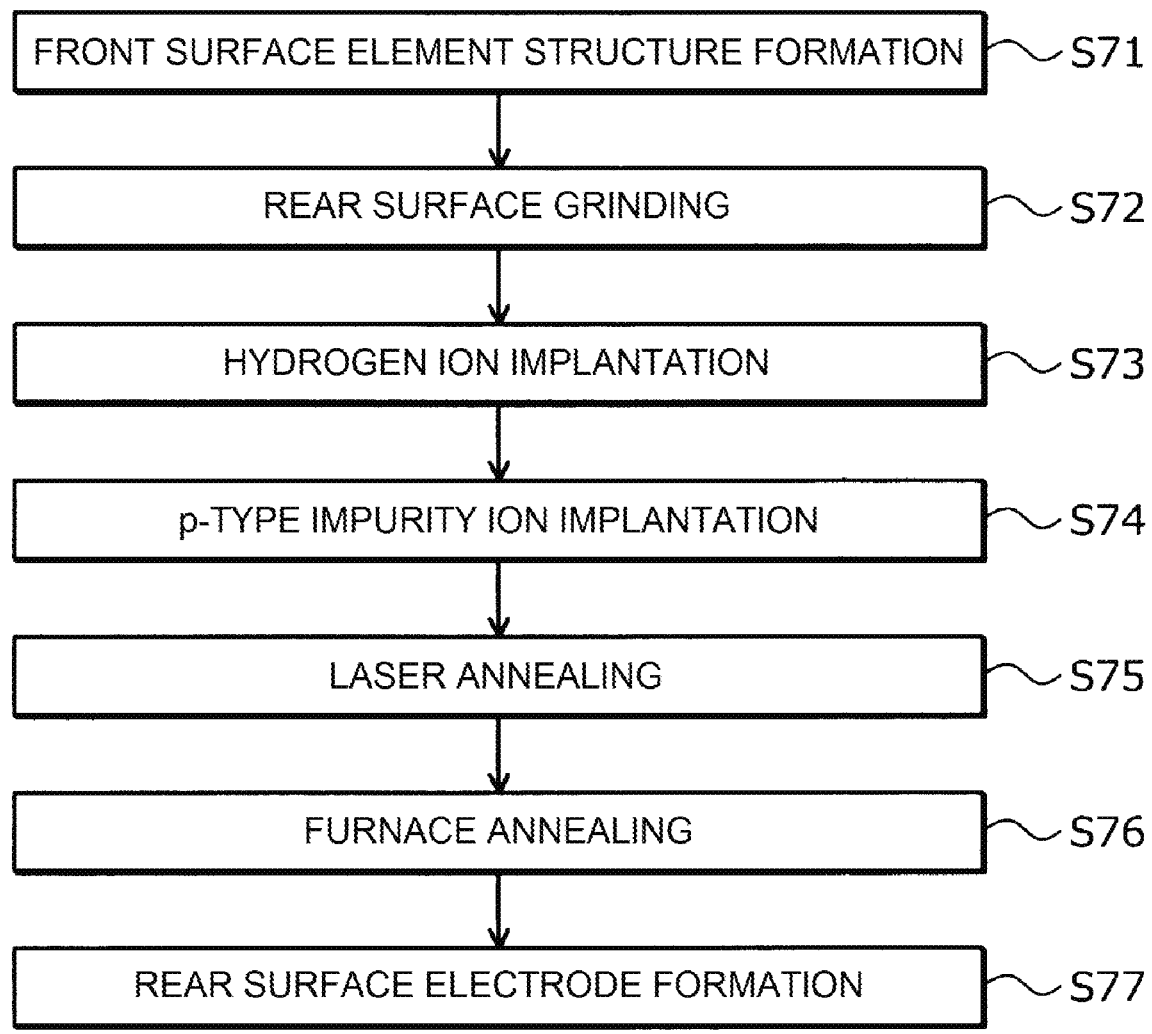
FIG. 25 is a flow chart depicting an overview of a semiconductor device manufacturing method according to Embodiment 8.

A semiconductor device manufacturing method according to Embodiment 8 will be described next. FIG. 25 is a flow chart depicting an overview of the semiconductor device manufacturing method according to Embodiment 8. A difference of the semiconductor device manufacturing method according to Embodiment 8 from the semiconductor device manufacturing method according to Embodiment 7 is that the hydrogen ion implantation is performed after the rear surface grinding and before the p-type impurity ion implantation. Even if the sequence of hydrogen ion implantation, p-type impurity ion implantation and laser annealing is changed, the n-type FS layer can be formed in a deep region from the substrate rear surface, and carrier lifetime can be adjusted based on the hydrogen dose of the hydrogen implanted region formed in a shallower region than the n-type FS layer from the substrate rear surface, in the same manner as in Embodiment 7.

In concrete terms, in the same manner as in Embodiment 7, the front surface element structure is formed and the rear surface is ground sequentially (steps S71, S72). Then the hydrogen ion implantation (step S73), the p-type impurity ion implantation (step S74), the laser annealing (step S75), the furnace annealing (step S76), and the rear surface electrode formation (step S77) are sequentially performed, whereby the IGBT including the n-type FS layer is completed. The conditions of the hydrogen ion implantation, the p-type impurity ion implantation, the laser annealing, the furnace annealing and the rear surface electrode formation are the same as Embodiment 7.

As described above, according to Embodiment 8, an effect similar to Embodiment 1 to 6 can be implemented.

Embodiment 9

Figure 26:
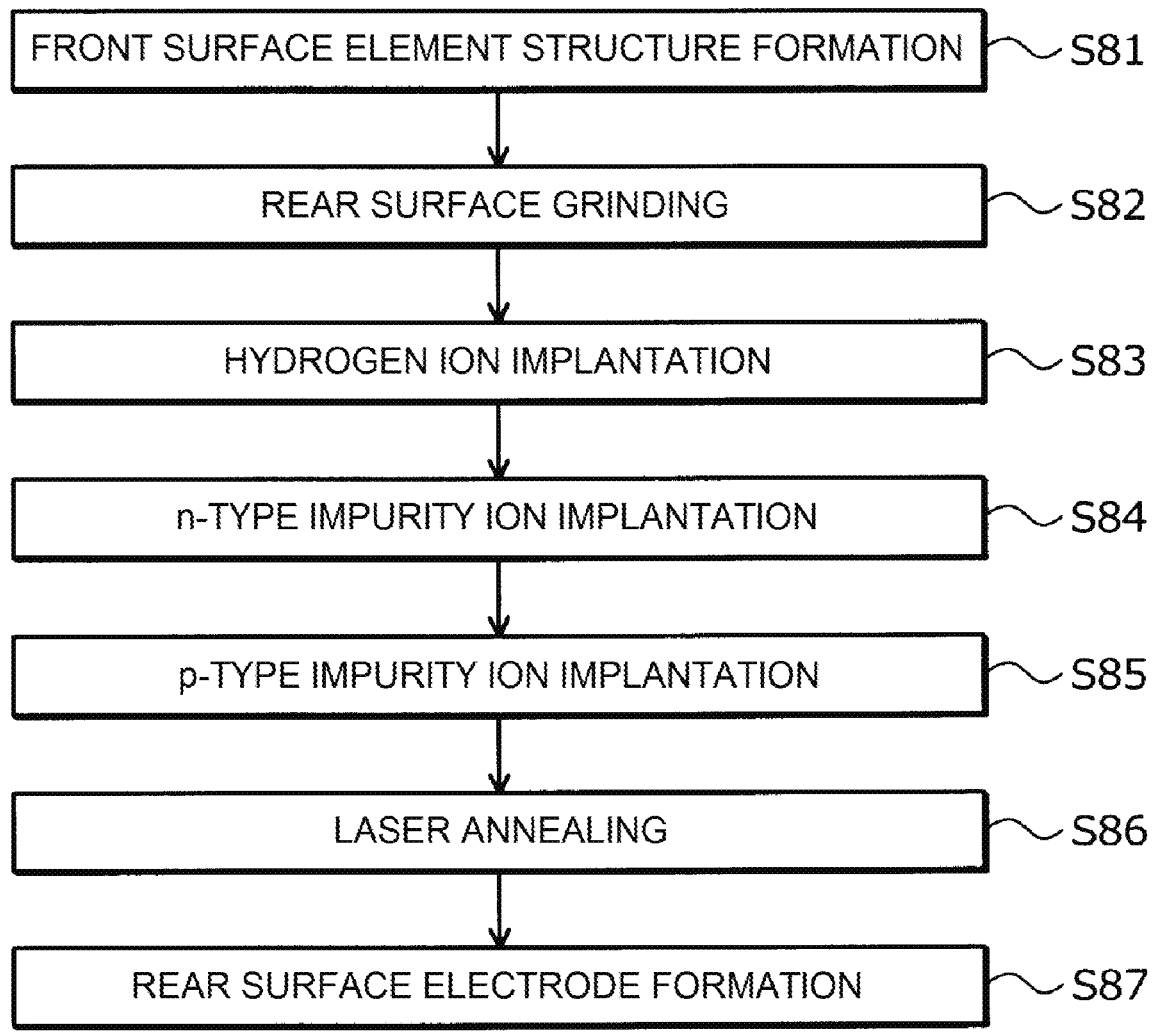
FIG. 26 is a flow chart depicting an overview of a semiconductor device manufacturing method according to Embodiment 9.

A semiconductor device manufacturing method according to Embodiment 9 will be described next. FIG. 26 is a flow chart depicting an overview of the semiconductor device manufacturing method according to Embodiment 9. A difference of the semiconductor device manufacturing method according to Embodiment 9 from the semiconductor device manufacturing method according to Embodiment 8 is that the n-type FS layer is formed in a shallow region from the substrate rear surface by the n-type impurity ion implantation and laser annealing. The semiconductor device manufacturing method according to Embodiment 9 is useful when the n-type FS layer is formed in a shallow region from the substrate rear surface where impurities can be introduced by the ion implantation of elements, such as phosphorus and arsenic, of which ranges are shorter than hydrogen.

In concrete terms, in the same manner as in Embodiment 8, the front surface element structure is formed and the rear surface is ground sequentially (steps S81, S82). Then the hydrogen ion implantation is performed from the ground rear surface side of the n$^-$-type semiconductor substrate, and the hydrogen implanted region is formed at a predetermined depth from the substrate rear surface (step S83). For the hydrogen ion implantation in step S83, only the hydrogen implanted region is formed, in the same manner as in Embodiment 1. The conditions of the hydrogen ion implantation are the same as Embodiment 1. For example, n-type impurities, such as phosphorus, are ion-implanted from the rear surface side of the n$^-$-type semiconductor substrate (n-type impurity ion implantation), and the n-type impurities are introduced to the region to form the n-type FS layer (step S84).

Then the p-type impurities are introduced to the region to form the p$^+$-type collector layer by the p-type impurity ion implantation (step S85). Then the n-type impurities and the p-type impurities implanted in the rear surface side of the n$^-$-type semiconductor substrate are activated (step S86). Thereby the p$^+$-type collector layer is formed on the surface layer of the rear surface of the n$^-$-type semiconductor substrate, and the n-type FS layer is formed in a region deeper than the p$^+$-type collector layer from the substrate rear surface. Then the rear surface electrode is formed (step S87), whereby the IGBT, including the n-type FS layer, is completed. The conditions of the p-type impurity ion implantation and the rear surface electrode formation may be the same as Embodiment 8. Step S84 which introduces the n-type impurities and step S85 which introduces the p-type impurities may be reversed.

As described above, according to Embodiment 9, the effect similar to Embodiments 1 to 6 can be implemented.

Embodiment 10

Figure 27:
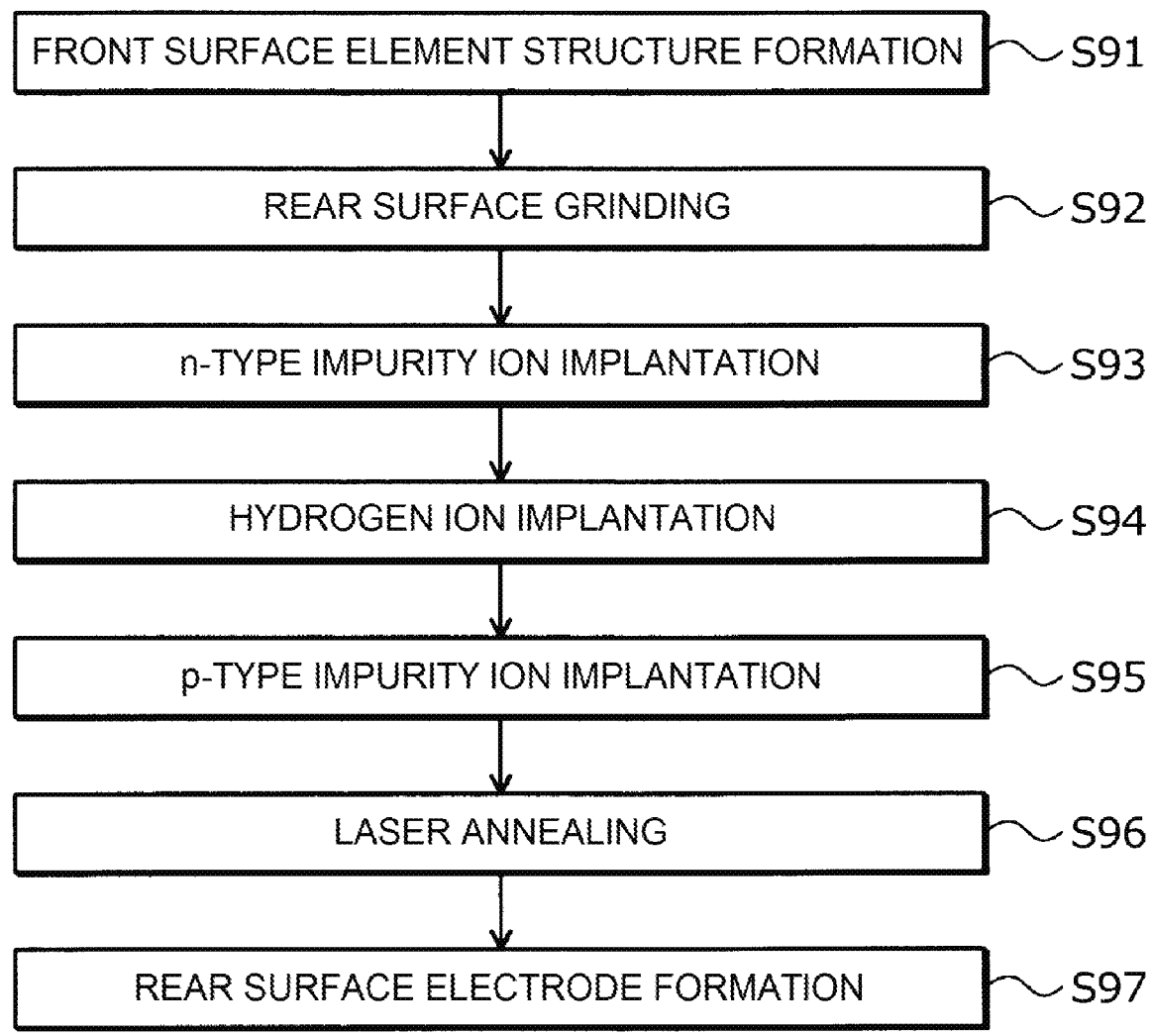
FIG. 27 is a flow chart depicting an overview of a semiconductor device manufacturing method according to Embodiment 10.

A semiconductor device manufacturing method according to Embodiment 10 will be described next. FIG. 27 is a flow chart depicting an overview of the semiconductor device manufacturing method according to Embodiment 10. A difference of the semiconductor device manufacturing method according to Embodiment 10 from the semiconductor device manufacturing method according to Embodiment 9 is that the hydrogen ion implantation is performed between the n-type impurity ion implantation and the p-type impurity ion implantation.

In concrete terms, in the same manner as in Embodiment 9, the front surface element structure is formed and the rear surface is ground sequentially (steps S91, S92). Then the n-type impurity ion implementation (step S93), the hydrogen ion implantation (step S94), the p-type impurity ion implantation (step S95), the laser annealing (step S96) and the rear surface electrode formation (step S97) are sequentially performed, whereby the IGBT, including the n-type FS layer, is completed. The conditions of the n-type impurity ion implantation, the hydrogen ion implantation, the p-type impurity ion implantation, the laser annealing and the rear surface electrode formation are the same as Embodiment 9. Step S93 which introduces the n-type impurities and step S95 which introduces the p-type impurities may be reversed.

As described above, according to Embodiment 10, an effect similar to Embodiment 9 can be implemented.

Embodiment 11

Figure 28:
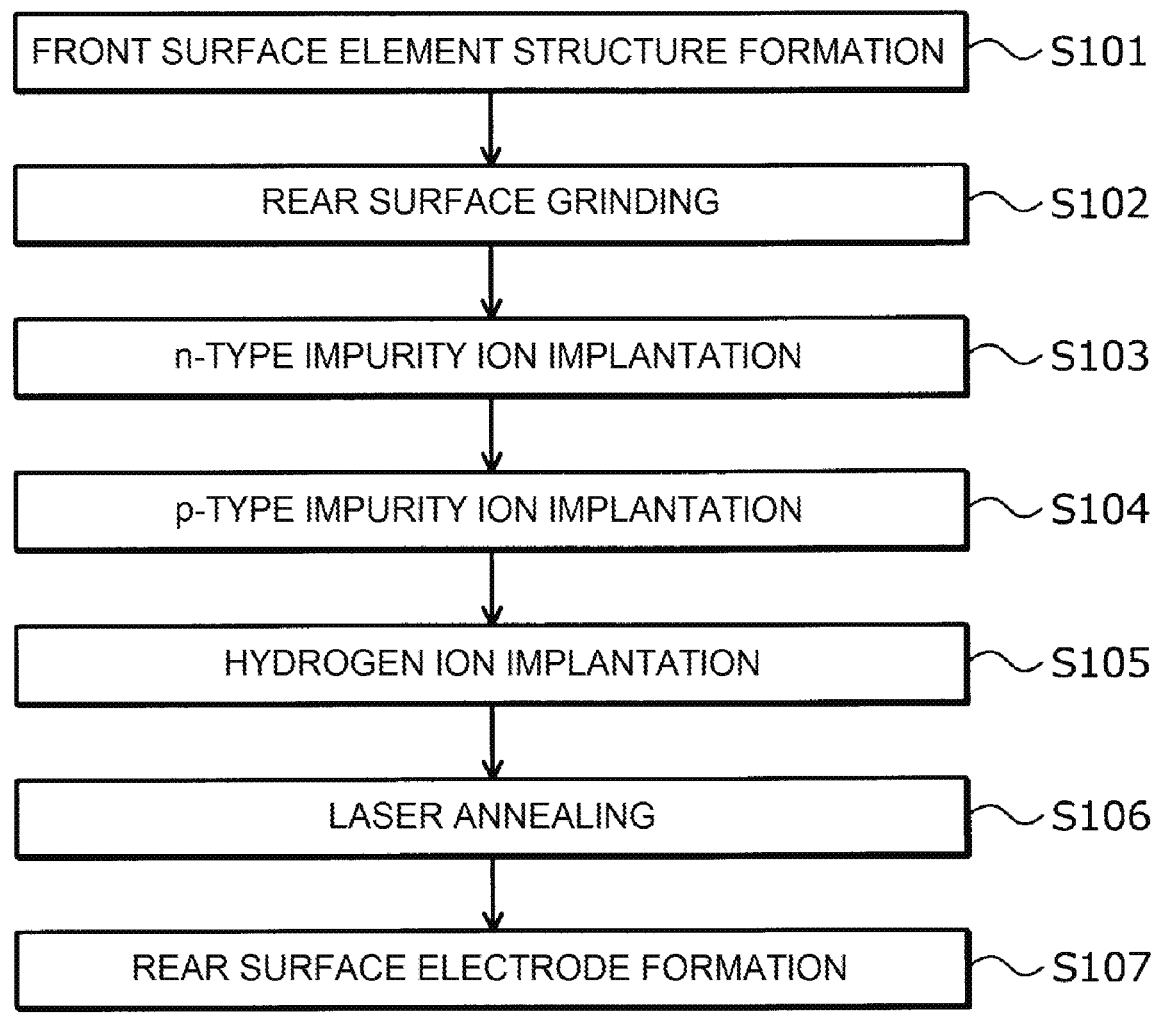
FIG. 28 is a flow chart depicting an overview of a semiconductor device manufacturing method according to Embodiment 11.

A semiconductor device manufacturing method according to Embodiment 11 will be described next. FIG. 28 is a flow chart depicting an overview of the semiconductor device manufacturing method according to Embodiment 11. A difference of the semiconductor device manufacturing method according to Embodiment 11 from the semiconductor device manufacturing method according to Embodiment 9 is that the hydrogen ion implantation is performed between the p-type impurity ion implantation and the laser annealing.

In concrete terms, in the same manner as in Embodiment 9, the front surface element structure is formed and the rear surface is ground sequentially (steps S101, S102). Then the n-type impurity ion implantation (step S103), the p-type impurity ion implantation (step S104), the hydrogen ion implantation (step S105), the laser annealing (step S106) and the rear surface electrode formation (step S107) are sequentially performed, whereby the IGBT, including the n-type FS layer, is completed. The conditions of the n-type impurity ion implantation, the p-type impurity ion implantation, the hydrogen ion implantation, the laser annealing and the rear surface electrode formation are the same as Embodiment 9. The sequence of the n-type impurity ion implantation and the p-type impurity ion implantation may be reversed.

As described above, according to Embodiment 11, an effect similar to Embodiments 9 and 10 can be implemented.

Embodiment 12

Figure 29B:
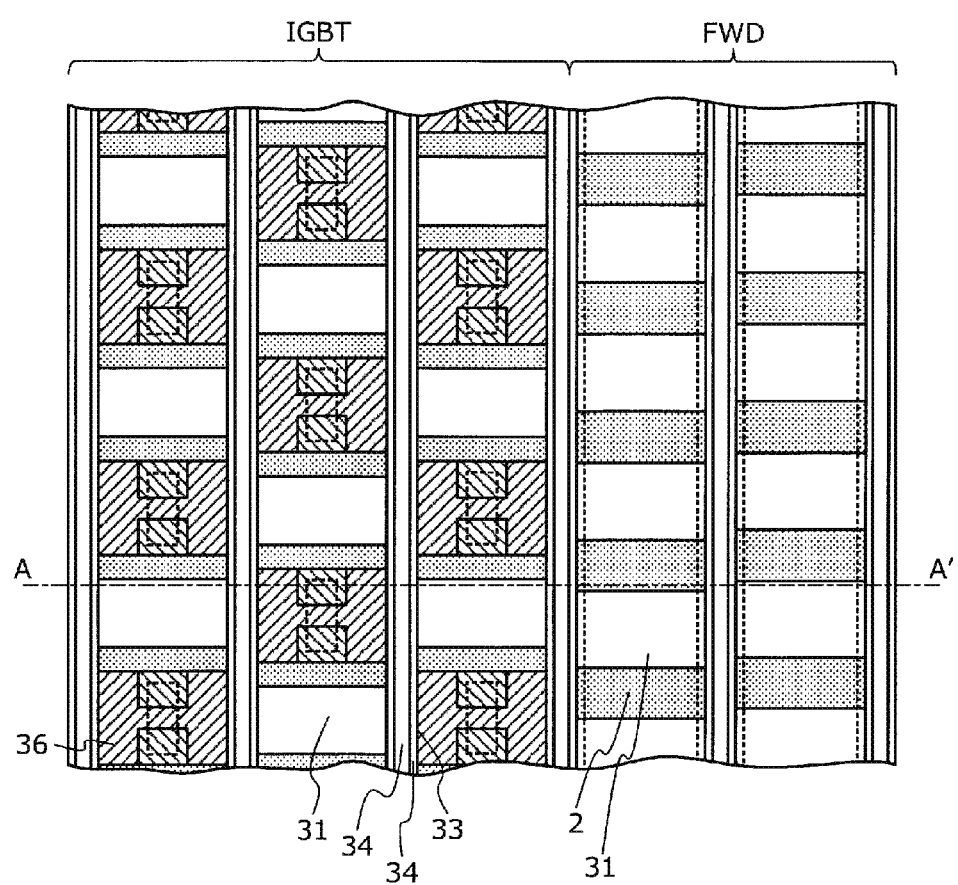
FIG. 29B is a plan view depicting an example of a structure of the semiconductor device according to Embodiment 12.
Figure 29C:
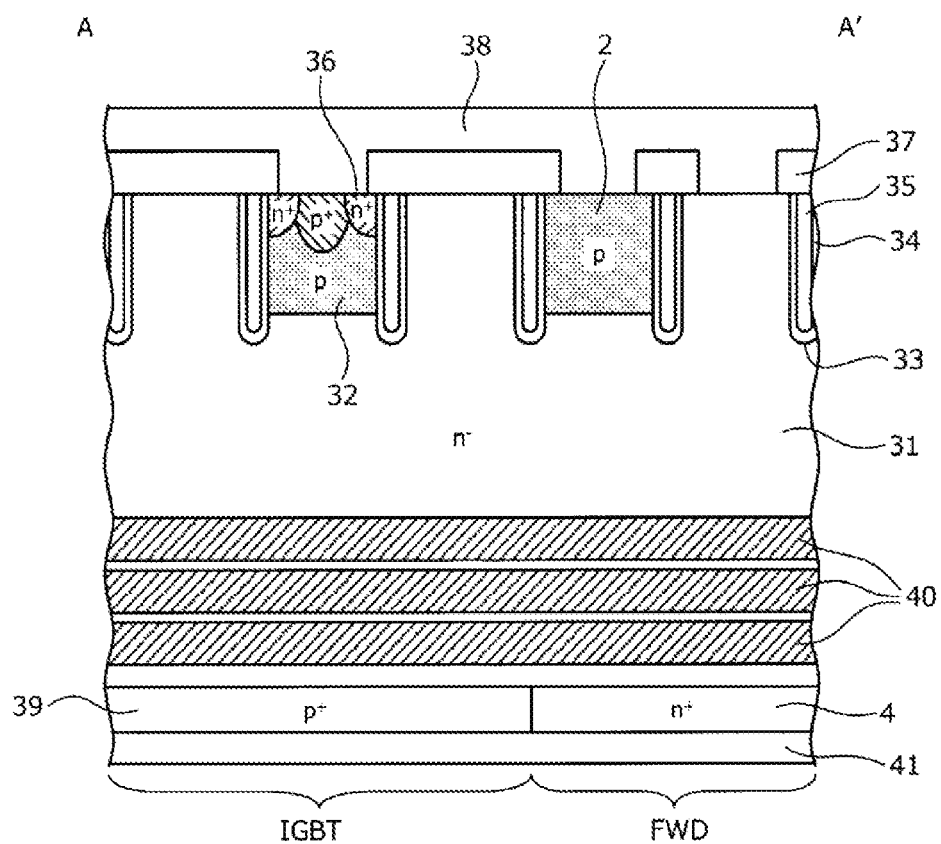
FIG. 29C is a cross-sectional view depicting a cross-sectional structure at the sectional line A-A' in FIG. 29B.

A semiconductor device manufacturing method according to Embodiment 12 will be described next. FIG. 29A is a flow chart depicting an overview of the semiconductor device manufacturing method according to Embodiment 12. FIG. 29B is a plan view depicting an example of a structure of the semiconductor device according to Embodiment 12. FIG. 29C is a cross-sectional view depicting a cross-sectional structure at the sectional line A-A' in FIG. 29B. The semiconductor device manufacturing method according to Embodiment 12 is a method of fabricating a reverse conducting IGBT (RC-IGBT) where an IGBT, which includes the n-type FS layer 40 and a free wheeling diode (FWD), are disposed on a same n$^-$-type semiconductor substrate by applying Embodiment 2.

In the case of fabricating the RC-IGBT as well, the hydrogen implanted region can be formed in a region shallower than the n-type FS layer 40 from the substrate rear surface by the hydrogen ion implantation that implants hydrogen in the region to form the n-type FS layer 40, in the same manner as in Embodiment 2. Thereby leak current can be decreased. The semiconductor device manufacturing method according to Embodiment 12 is useful when the n-type FS layer 40 is formed in a deep region from the substrate rear surface, where impurities cannot be introduced by ion implantation.

In concrete terms, a standard MOS gate structure of IGBT, and a front surface element structure, which is constituted by a p-type anode layer 2 of FWD, a front surface electrode that has the functions of an emitter electrode 38 and an anode electrode (hereafter called "emitter electrode 38"), a termination withstand voltage structure, and a passivation film, are formed on the front surface side of the n$^-$-type semiconductor substrate to be the n$^-$-type drift layer 31 (step S110). The MOS gate structure is constituted by a p-type base layer 32, a trench 33, a gate insulation film 34, a gate electrode 35 and an n$^+$-type emitter region 36. The reference numeral 37 denotes an inter-layer insulation film. Then the rear surface is ground (step S111). Then p-type impurities are introduced to the region to form the p$^+$-type collector layer 39 by the p-type impurity ion implantation from the ground rear surface side of the n$^-$-type semiconductor substrate (step S112). The n-type impurities are introduced to the region to form the n$^+$-type cathode layer 4 by the n-type impurity ion implantation from the ground rear surface side of the n$^-$-type semiconductor substrate (step S113).

Then the n-type impurities and the p-type impurities implanted on the rear surface side of the n$^-$-type semiconductor substrate are activated by laser annealing (step S114). Thereby the p$^+$-type collector layer 39 is selectively formed on the surface layer on the rear surface of the n$^-$-type semiconductor substrate, and the n$^+$-cathode layer 4 is formed so as to be parallel with the p$^+$-type collector layer 39 in the direction parallel with the principal surface of the substrate, and in contact with the p$^+$-type collector layer 39. Then hydrogen ions are implanted from the ground rear surface side of the n$^-$-type semiconductor substrate, so as to implant hydrogen into a region to form the n-type FS layer 40 inside the n$^-$-type drift layer 31 (step S115). For the hydrogen ion implantation in step S115, protons are implanted, for example, in the same manner as in Embodiment 2. By this hydrogen ion implantation, a hydrogen implanted region is formed in a region shallower than the n-type FS layer 40 from the substrate rear surface.

Then the first furnace annealing is performed for ionizing hydrogen atoms introduced to the n$^-$-type semiconductor substrate and generating the hydrogen induced donor, whereby the generation of a hydrogen induced donor is accelerated and a donor layer to be the n-type FS layer 40 is formed (step S116). Then in order to introduce a lifetime killer (defects or impurities) into a region shallower than the n-type FS layer 40 from the substrate rear surface, electron beams are irradiated or helium (He) ions are implanted (hereafter called "helium ion implantation") (step S117), then the second furnace annealing is performed (step S118). Thereby the carrier lifetime is adjusted so that an appropriate ON voltage and reverse recovery loss, based on the hydrogen dose of the hydrogen implanted region, are implanted. Then the rear surface electrode 41, which functions as the collector electrode and the cathode electrode and which is in contact with the p$^+$-type collector layer 39 and the n$^+$-type cathode layer 4 is formed (step S119), whereby the RC-IGBT is completed.

The conditions of the rear surface grinding, the n-type impurity ion implantation, the hydrogen ion implantation and the first furnace annealing may be the same as Embodiment 2, for example. The conditions of the p-type impurity ion implantation and the laser annealing may be the same as Embodiment 7, for example. If the electron beam irradiation is performed in step S117, the conditions of the electron beam irradiation and the second furnace annealing in steps S117 and S118 may be the same as Embodiment 2. Soft recovery of the FWD can be implemented. If helium ion implantation is performed in step S117, the conditions of the helium ion implantation and the second furnace annealing in steps S117 and S118 may be the same as the later mentioned Embodiment 16. Since the hydrogen ion implantation is performed after the laser annealing, the n-type FS layer 40 is not influenced by dispersion of the laser annealing.

As described above, according to Embodiment 12, an effect similar to Embodiments 1 to 6 can be implemented.

Embodiment 13

Figure 30:
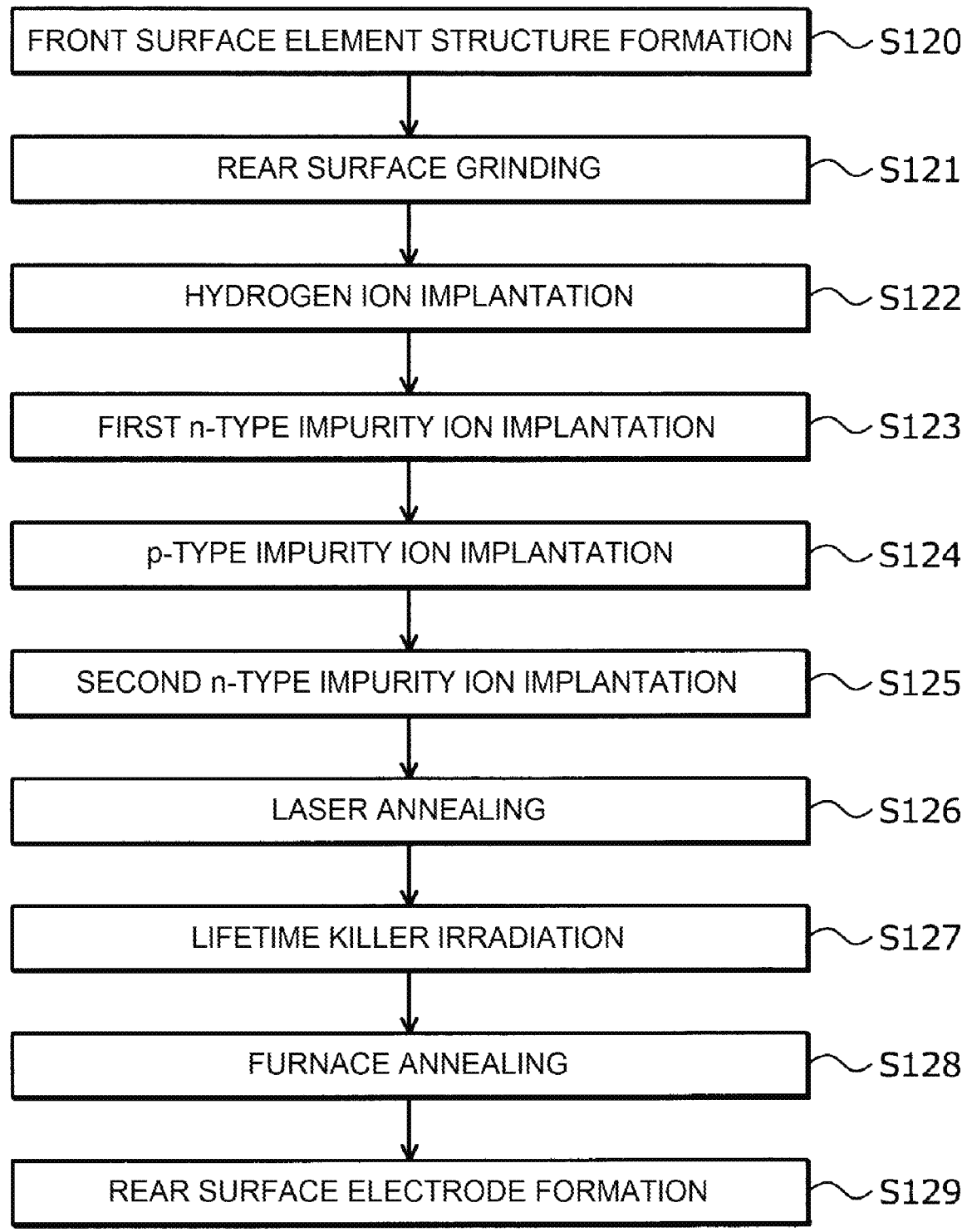
FIG. 30 is a flow chart depicting an overview of a semiconductor device manufacturing method according to Embodiment 13.

A semiconductor device manufacturing method according to Embodiment 13 will be described next. FIG. 30 is a flow chart depicting an overview of the semiconductor device manufacturing method according to Embodiment 13. A difference of the semiconductor device manufacturing method according to Embodiment 13 from the semiconductor device manufacturing method according to Embodiment 12 is that the n-type FS layer is formed by n-type impurity ion implantation and laser annealing. The semiconductor device manufacturing method according to Embodiment 13 is useful when the n-type FS layer is formed in a shallow region from the substrate rear surface where impurities can be introduced by ion implantation.

In concrete terms, the front surface element structure is formed and the rear surface is ground sequentially (steps S120, S121), in the same manner as in Embodiment 12. Then the hydrogen ion implantation is performed from the ground rear surface side of the n$^-$-type semiconductor substrate, and the hydrogen implanted region is formed to have a predetermined depth from the substrate rear surface (step S122). In the hydrogen ion implantation in step S122, only the hydrogen implanted region is formed, in the same manner as in Embodiment 1. The conditions of the hydrogen ion implantation is the same as Embodiment 1, for example. Then n-type impurities, such as phosphorus, are ion-implanted from the rear surface side of the n$^-$-type semiconductor substrate (hereafter called "first n-type impurity ion implantation"), and the n-type impurities are introduced to the region to form the n-type FS layer (step S123).

Then the p-type impurities are introduced to the region to form the p$^+$-type collector layer by the p-type impurity ion implantation (step S124). Then the n-type impurities are ion-implanted from the rear surface side of the n$^-$-type semiconductor substrate (hereafter called "second n-type impurity ion implantation"), and the n-type impurities are introduced to the region to form the n$^+$-type cathode layer (step S125). Then the n-type impurities and the p-type impurities implanted on the rear surface side of the n$^-$-type semiconductor substrate are activated (step S126). Then the p$^+$-type collector layer and the n$^+$-type cathode layer are formed on the surface layer on the rear surface of the n$^-$-type semiconductor substrate, and the n-type FS layer is formed in a region deeper than the p$^+$-type collector layer from the substrate rear surface.

Then the lifetime killer irradiation (step S127), the furnace annealing (step S128) and the rear surface electrode formation (step S129) are sequentially performed, whereby the RC-IGBT is completed. The conditions of the first n-type impurity ion implantation may be the same as the n-type impurity ion implantation in Embodiment 9. The conditions of the p-type impurity ion implantation, the second n-type impurity ion implantation, the laser annealing, the lifetime killer irradiation and the rear surface electrode formation may be the same as Embodiment 12. The conditions of the furnace annealing may be the same as the second furnace annealing of Embodiment 12. The hydrogen ion implantation may be performed after the rear surface grinding and before the laser annealing, and may be performed at any timing after the rear surface grinding and before the laser annealing. Particularly, hydrogen has the effect of terminating dangling bonds generated by lattice defects, such as vacancy and divacancy, that remain on the rear surface by phosphorus or boron ion implantation. As a result, the efficiency of hole implantation of IGBT and electron implantation efficiency of a diode can be increased respectively.

As described above, according to Embodiment 13, an effect similar to Embodiment 1 to 6 can be implemented.

Embodiment 14

Figure 31:
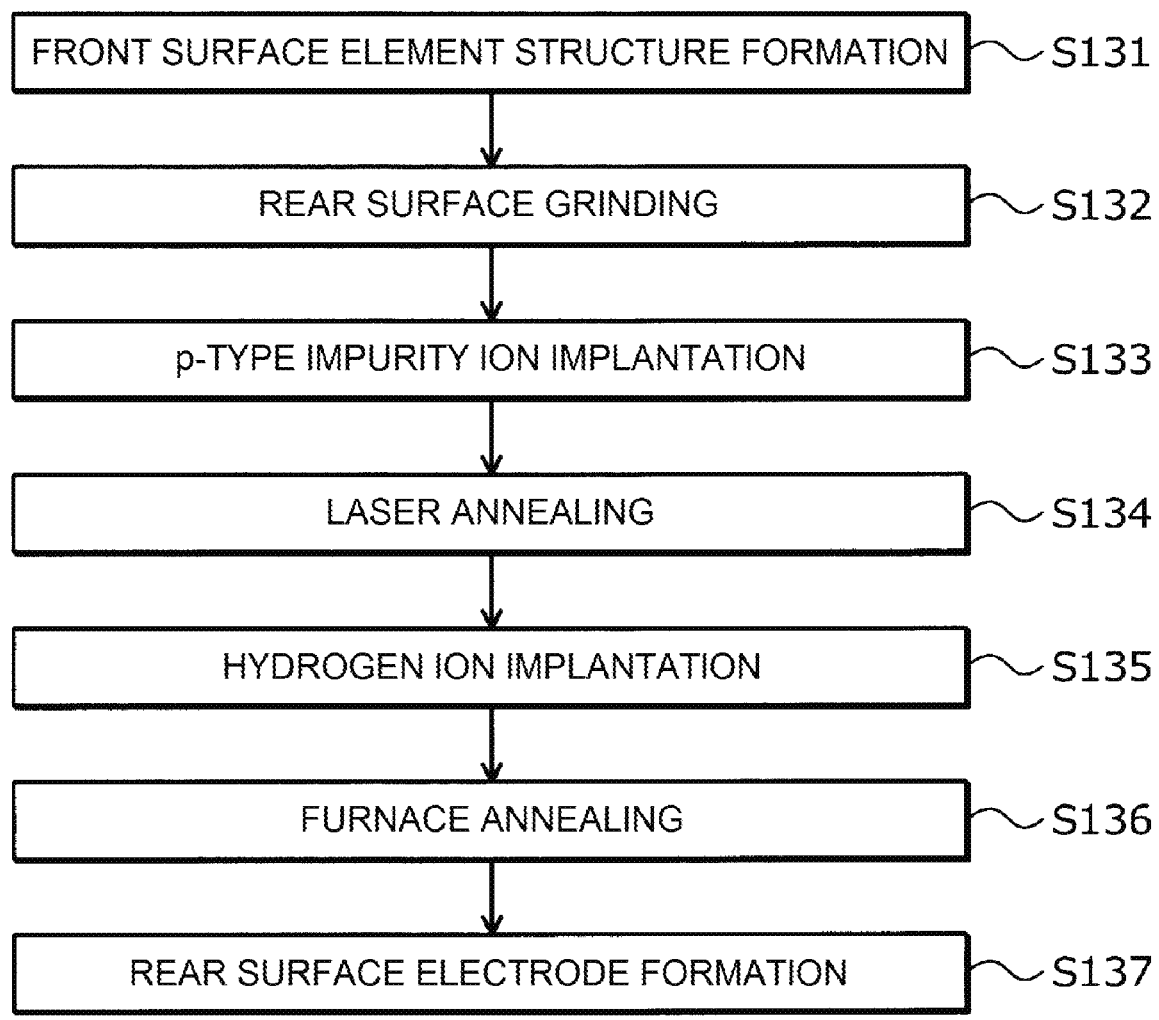
FIG. 31 is a flow chart depicting an overview of a semiconductor device manufacturing method according to Embodiment 14.
Figure 32:
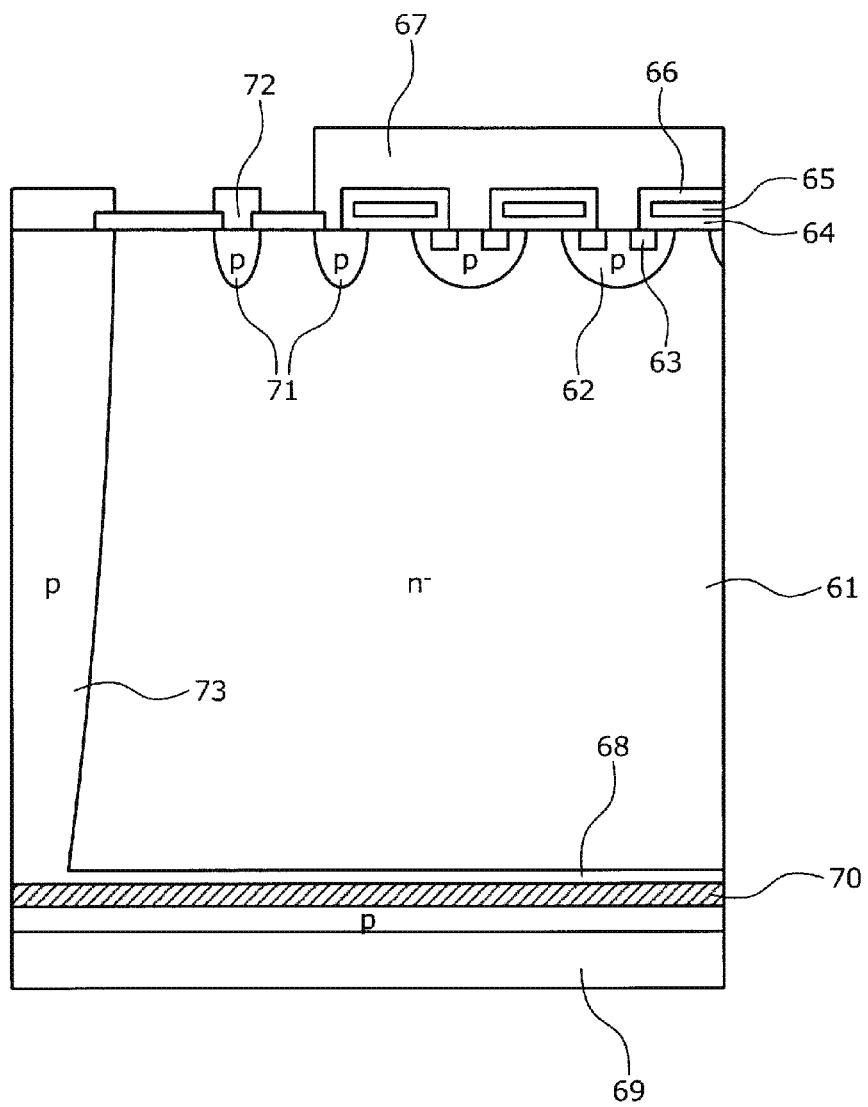
FIG. 32 is a cross-sectional view depicting an example of a semiconductor device manufactured by the semiconductor device manufacturing method according to Embodiment 14.

A semiconductor device manufacturing method according to Embodiment 14 will be described next. FIG. 31 is a flow chart depicting an overview of the semiconductor device manufacturing method according to Embodiment 14. FIG. 32 is a cross-sectional view depicting an example of a semiconductor device manufactured by the semiconductor device manufacturing method according to Embodiment 14. The semiconductor device manufacturing method according to Embodiment 14 is a method of fabricating a reverse blocking IGBT (RB-IGBT) illustrated in FIG. 32 by applying Embodiment 1. The reverse leak current can be decreased by forming a hydrogen implanted layer 70, in which generation of a hydrogen induced donor is accelerated, inside the p$^+$-type collector layer 68 of the RB-IGBT.

In concrete terms, a standard MOS gate structure, an emitter electrode 67 and a front surface element structure, which is constituted by a p-type separation diffusion layer 73, a termination withstand voltage structure, and a passivation film (not illustrated), are formed on the front surface side of the n$^-$-type semiconductor substrate to be the n$^-$-type drift layer 61 (step S131). The MOS gate structure is constituted by a p-type base layer 62, an n$^+$-type emitter region 63, a gate insulation film 64 and a gate electrode 65. The termination withstand voltage structure is constituted by a p-type guard ring region 71 and a field plate 72. The depth of the p-type separation diffusion layer 73 is deeper than the depth of the p-type base layer 62 or the p-type guard ring region 71. The reference numeral 66 denotes an inter-layer insulation film.

Then the n$^-$-type semiconductor substrate is ground from the rear surface side until reaching the position at which actual thickness of the semiconductor device as a product is implemented (step S132). In step S132, the p-type separation diffusion layer 73 is exposed to the ground rear surface of the n$^-$-type semiconductor substrate. Thereby the p-type separation diffusion layer 73 is disposed so as to penetrate from the substrate front surface to the rear surface, and be in contact with the p$^+$-type collector layer 68 in a later step. Then p-type impurities are introduced to the region to form the p$^+$-type collector layer 68 by the p-type impurity ion implantation (step S133). Then the p-type impurities implanted on the rear surface side of the n$^-$-type semiconductor substrate is activated by the laser annealing 53 (step S134). Thereby the p$^+$-type collector layer 68 that is in contact with the p-type separation diffusion layer 73 is formed on the surface layer of the rear surface of the n$^-$-type semiconductor substrate.

Then a hydrogen implanted region is formed inside the p$^+$-type collector layer 68 by hydrogen ion implantation (step S135). Then the furnace annealing is performed for ionizing hydrogen atoms and generating the hydrogen induced donor, whereby generation of the hydrogen induced donor of the hydrogen atoms inside the hydrogen implanted region is accelerated, and a hydrogen implanted layer 70 is formed inside the p$^+$-type collector layer 68 (step S136). Then the collector electrode 69 in contact with the p$^+$-type collector layer 68 is formed (step S137), whereby the RB-IGBT is completed. The conditions of the rear surface grinding, the hydrogen ion implantation and the furnace annealing may be the same as Embodiment 1. The conditions of the p-type impurity ion implantation, the laser annealing and the rear surface electrode formation may be the same as Embodiment 7.

In the case of RB-IGBT, the implanted hydrogen has an effect to terminate dangling bonds generated by lattice defects, such as vacancy and divacancy, in the p$^+$-type collector layer 68 on the rear surface. As a result, leak current, when reverse bias voltage is applied to the pn junction between the p$^+$-type collector layer 68 and the n$^-$-type drift layer 61 on the rear surface (reverse leak current), can be decreased.

As described above, according to Embodiment 14, an effect similar to Embodiment 1 to 6 can be implemented.

Embodiment 15

Figure 33:
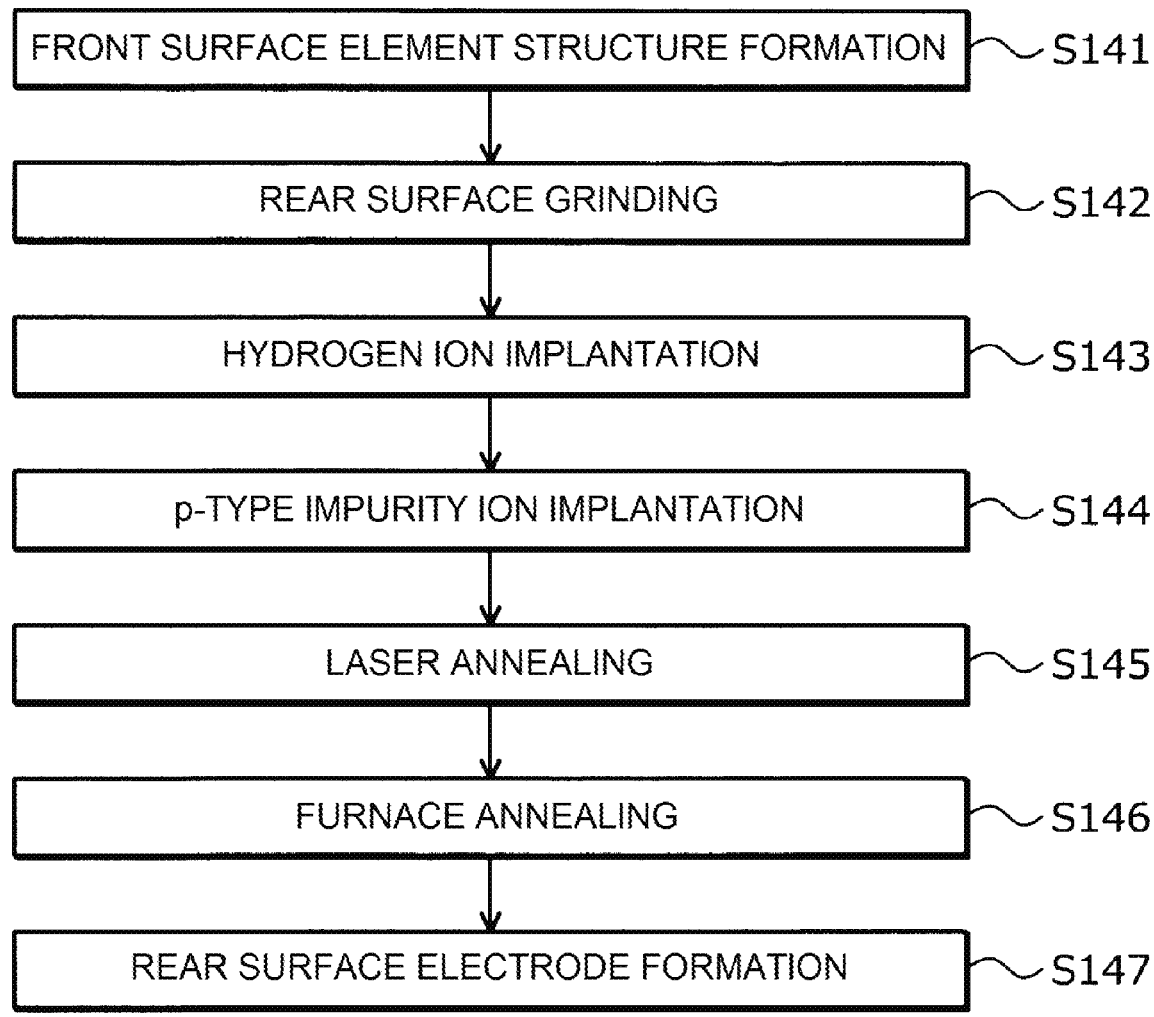
FIG. 33 is a flow chart depicting an overview of a semiconductor device manufacturing method according to Embodiment 15.

A semiconductor device manufacturing method according to Embodiment 15 will be described next. FIG. 33 is a flow chart depicting an overview of the semiconductor device manufacturing method according to Embodiment 15. A difference of the semiconductor device manufacturing method according to Embodiment 15 from the semiconductor device manufacturing method according to Embodiment 14 is that the hydrogen ion implantation is performed after the rear surface grinding and before the p-type impurity ion implantation. In other words, the sequence of hydrogen ion implantation, the p-type impurity ion implantation and the laser annealing may be changed.

In concrete terms, a front surface element structure is formed and a rear surface is ground sequentially (steps S141, S142), in the same manner as in Embodiment 14. Then hydrogen ion implantation (step S143), the p-type impurity ion implantation (step S144), the laser annealing (step S145), the furnace annealing (step S146) and the rear surface electrode formation (step S147) are sequentially performed, whereby the RB-IGBT is completed. In step S143, the hydrogen ion implantation is performed such that the hydrogen implanted region is formed in the region to form the $p^+$-type collector layer 68. The conditions of the hydrogen ion implantation, the p-type impurity ion implantation, the laser annealing, the furnace annealing and the rear surface electrode formation are the same as Embodiment 14. The hydrogen ion implantation and the p-type impurity ion implantation may be performed simultaneously by ion implantation, of which ion source is a mixed gas containing p-type impurities, such as diborane ($B_2H_6$), and hydrogen, for example.

As described above, according to Embodiment 15, an effect similar to Embodiment 14 can be implemented.

Embodiment 16

Figure 34:
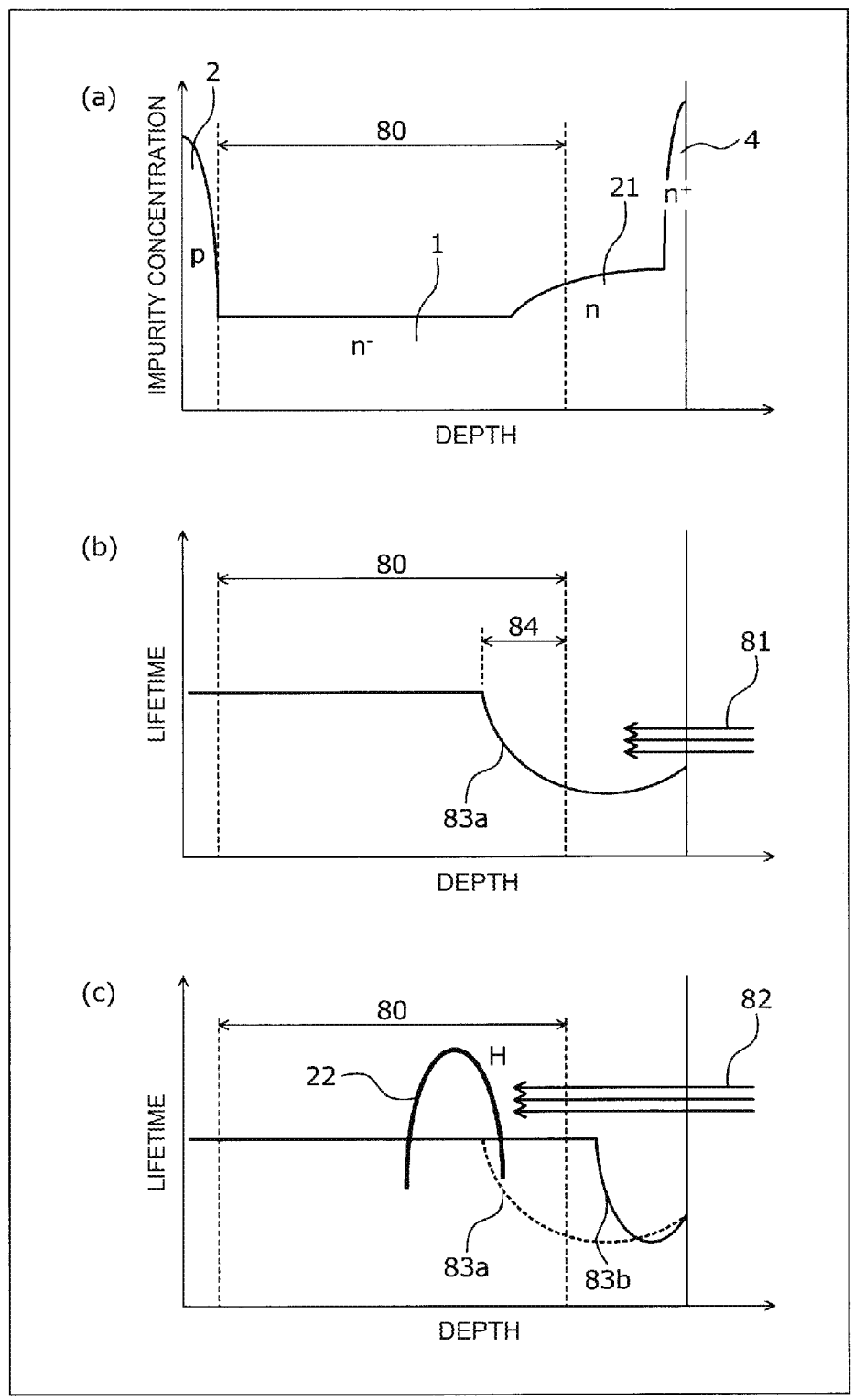
FIG. 34 is a flow chart depicting an overview of a semiconductor device manufacturing method according to Embodiment 16.
Figure 35:
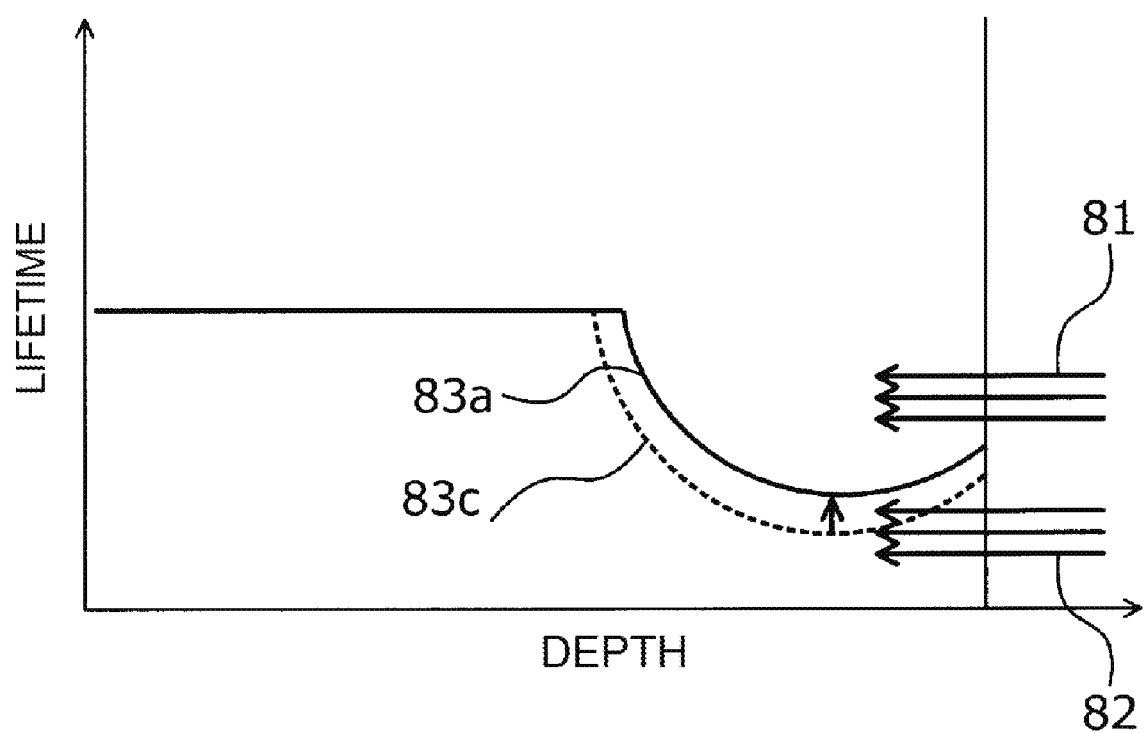
FIG. 35 is a flow chart depicting an overview of the semiconductor device manufacturing method according to Embodiment 16.
Figure 36:
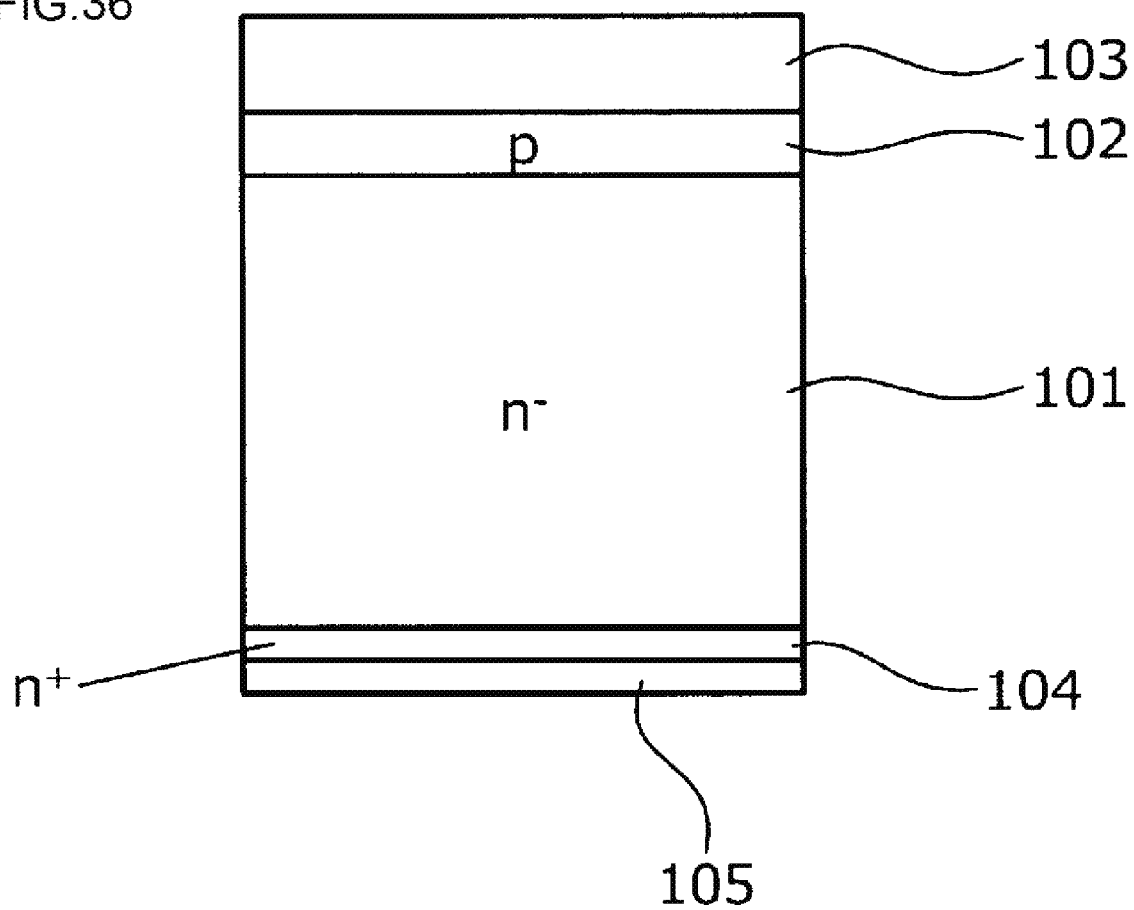
FIG. 36 is a cross-sectional view depicting a key portion of a conventional diode.

A semiconductor device manufacturing method according to Embodiment 16 will be described next. FIG. 34 and FIG. 35 are diagrams depicting an overview of the semiconductor device manufacturing method according to Embodiment 16. A difference of the semiconductor device manufacturing method according to Embodiment 16 from the semiconductor device manufacturing method according to Embodiment 1 is that the carrier lifetime is adjusted by helium (He) ion implantation (hereafter called "helium ion implantation 81") and hydrogen ion implantation 82. In concrete terms, in the case of the semiconductor device manufacturing method according to Embodiment 16, the helium ion implantation 81 may be performed instead of the electron beam irradiation in the semiconductor device manufacturing method according to Embodiment 1, or the helium ion implantation 81 may be performed before or after the electron beam irradiation.

FIG. 34A shows an example of an impurity concentration distribution of a pin diode fabricated by the semiconductor device manufacturing method according to Embodiment 16. FIG. 34B, FIG. 34C and FIG. 35 show carrier lifetime distributions during manufacturing the semiconductor device according to Embodiment 16. In FIG. 34, depth=0 µm is the position of the front surface of the $n^-$-type semiconductor substrate (that is, the interface between the p-type anode layer 2 and the anode electrode) (this is the same for FIG. 35). In the pin diode shown in FIG. 34A, the region from the pn junction between the p-type anode layer 2 and the $n^-$-type drift layer 1 to the anode side portion of the n-type FS layer 21 (the region between the two vertical dotted lines) is a region that is depleted when the rated current is applied (hereafter called "depletion region 80").

To fabricate this pin diode, a front surface element structure is formed first, in the same manner as in Embodiment 1 (step S1). Then as shown in FIG. 34B, helium ions, accelerated by a cyclotron (accelerator), for example, is implanted from the cathode side to the $n^-$-type semiconductor substrate (helium ion implantation 81), instead of the electron beam irradiation (step S2) or before or after the electron beam irradiation. Thereby defects are generated in the region from the substrate rear surface to a predetermine depth (hereafter called "defect region 83a"), and the carrier lifetime on the front surface side (anode side) of the $n^-$-type semiconductor substrate becomes shorter than the carrier lifetime on the rear surface side (cathode side) of the $n^-$-type semiconductor substrate. The carrier lifetime distribution of the defect region 83a becomes a wide distribution (broad distribution) having one peak in a diminishing direction of the carrier lifetime. Therefore the defect region 83a reaches a depth that overlaps (superposes) with the depletion region 80.

Then, in the same manner as in Embodiment 1, the steps from the furnace annealing to the n-type impurity ion implantation (steps S3 to S5) are sequentially performed. Then as shown in FIG. 34C, the hydrogen implanted region 22 is formed by performing the hydrogen ion implantation 82 (step S6) in the same manner as Embodiment 1, and defects in the portion 84 of the defect region 83a (dotted line) overlapping with the depletion region 80 are recovered. In the state of the defect region 83a overlapping with the depletion region 80, leak current (recovering peak current Irp) increases as mentioned above, but if the hydrogen implanted region 22 is formed by the hydrogen ion implantation 82, carrier lifetime recovers in a range that is wider than the width of the hydrogen implanted region 22 by about 40 µm to the substrate front surface side and to the substrate rear surface side respectively. Thereby the carrier lifetime in the portion 84 of the defect region 83a overlapping with the depletion region 80 approximately returns to the state before the helium ion implantation 81, and the width of the defect region 83b (solid line) after the hydrogen ion implantation 82 becomes a width that does not overlap with the depletion region 80. As a result, the leak current can be decreased.

Furthermore, as shown in FIG. 35, if the defect region 83c (dotted line), of which carrier lifetime is short, is formed by the helium ion implantation 81 and a part [of the defect region 83c] is recovered by the hydrogen ion implantation 82, it becomes possible to return to the carrier lifetime which is equivalent to the carrier lifetime of the region 83a (solid line) where the same amount of lifetime killer was introduced by the helium ion implantation 81 alone. Moreover, the characteristics of the pin diode are improved, and leak current can be further reduced than the case of forming the lifetime killer by the helium ion implantation 81 alone. Normally when a particle type lifetime killer is formed, thermal treatment is performed in a hydrogen atmosphere after the particles are irradiated, whereby defects having an energy level around the center of the energy band that largely contributes to increasing the leak current is selectively removed. The effect obtained by this thermal treatment in the hydrogen atmosphere is probably obtained by the hydrogen ion implantation 82 as well. After the hydrogen ion implantation 82, the laser annealing (step S7) and later steps are sequentially performed, in the same manner as in Embodiment 1, whereby the pin diode is completed.

In the case of fabricating the pin diode that includes the n-type FS layer 21 as shown in FIG. 34A, Embodiment 16 can be applied to Embodiment 2. Embodiment 16 may be applied to Embodiments 3 to 15.

As described above, according to Embodiment 16, an effect similar to Embodiments 1 to 15 can be implemented.

The present invention is not limited to the embodiments described above, but may be modified in numerous ways within a scope of not departing from the true spirit of the invention. For example, the diode was described as an example in each embodiment, but [the present invention] can be applied to various devices of which carrier lifetime in the semiconductor region must be locally controlled. The semiconductor device according to Embodiment 1 may be fabricated by the manufacturing steps described in Embodiment 2. In other words, in Embodiment 2, the hydrogen ion implantation may be performed for a portion to increase the carrier lifetime on the substrate rear surface side.

INDUSTRIAL APPLICABILITY

As described above, the semiconductor device and the semiconductor device manufacturing method according to the present invention are useful for power semiconductor devices which are used for power conversion devices, such as convertors and invertors, and power supply devices of various industrial machines.

EXPLANATION OF REFERENCE NUMERALS 1 n⁻-type drift layer
2 p-type anode layer
3 anode electrode
4 n⁺-type cathode layer
5 cathode electrode
6, 22 hydrogen implanted region
11 electron beam irradiation
12 defect
13 n-type impurity ion implantation
14 hydrogen ion implantation
21 n-type field stop layer

The invention claimed is:

1. A manufacturing method for a semiconductor device having a semiconductor substrate with a front surface and a rear surface opposite the front surface, in which a lifetime of carriers is locally controlled, comprising:
an electron beam irradiation step of irradiating an electron beam from the front surface of the semiconductor substrate and generating dangling bonds by breaking inter-atomic bonds of atoms constituting the semiconductor substrate so as to form defects in first and second regions of the semiconductor substrate, the first region being located at a rear surface side of the semiconductor substrate, the second region being located at a front surface side of the semiconductor substrate; and
before or after the electron beam irradiation step, a first implantation step of implanting hydrogen atoms from the rear surface of the semiconductor substrate so that a hydrogen concentration of the first region is higher than a hydrogen concentration of the semiconductor substrate before starting the manufacturing of the semiconductor device, the hydrogen atoms being implanted into the first region but not the second region so that the dangling bonds of the defects in the first region are terminated by the hydrogen atoms such that a lifetime of carriers in the first region is longer than a lifetime of carriers in the second region, a highest peak of the hydrogen concentration in the first region being located closer to the rear surface of the semiconductor substrate than is an interface between the first region and the second region.

2. The semiconductor device manufacturing method according to claim 1, further comprising a second implantation step of implanting impurities on the rear surface side of the semiconductor substrate after the electron beam irradiation step, wherein
the first implantation step is executed simultaneously with the second implantation step.

3. The semiconductor device manufacturing method according to claim 2, further comprising a laser irradiation step of irradiating a laser to the rear surface side of the semiconductor substrate after the first implantation step and after the second implantation step, so as to activate the impurities, wherein
the hydrogen atoms are implanted to a depth less than a penetration depth of the laser.

4. The semiconductor device manufacturing method according to claim 2,
wherein the semiconductor substrate is of a first conductivity type,
the method further comprising a step of forming a second conductivity type layer on a surface layer of the front surface side of the semiconductor substrate,
wherein impurities of the first conductivity type are implanted in the second implantation step, so as to form a first conductivity type layer on a surface layer of the rear surface side of the semiconductor substrate.

5. A semiconductor device manufacturing method, the semiconductor device having a semiconductor substrate with one principle surface and an other principle surface opposite the one principle surface, comprising:
an element surface structure forming step of forming an element structure on one principal surface of the semiconductor substrate;
a charged particle beam irradiation step of irradiating a charged particle beam onto the semiconductor substrate and generating dangling bonds by breaking inter-atomic bonds of atoms constituting the semiconductor substrate so as to form defects in first and second regions of the semiconductor substrate, the first region being located at a one principal surface side of the semiconductor substrate, the second region being located at an other principle surface side of the semiconductor substrate; and
a first implantation step of implanting hydrogen atoms from the other principal surface of the semiconductor substrate so that a hydrogen concentration of the first region is higher than a hydrogen concentration of the semiconductor substrate before starting the manufacturing of the semiconductor device, the hydrogen atoms being implanted into the first region but not the second region so that the dangling bonds of the defects in the first region are terminated by the hydrogen atoms, so as to make a lifetime of carriers in the first region be longer than a lifetime of carriers in the second region, a highest peak of the hydrogen concentration in the first region being located closer to the other principal surface of the semiconductor substrate than is an interface between the first region and the second region.

6. The semiconductor device manufacturing method according to claim 5, wherein the charged particle beam irradiation step is executed after the first implantation step.

7. The semiconductor device manufacturing method according to claim 5, further comprising a thinning step of thinning the semiconductor substrate by grinding the semiconductor substrate from the other principal surface after the element surface structure forming step and before the first implantation step.

8. The semiconductor device manufacturing method according to claim 7, wherein the hydrogen atoms are implanted from a ground surface of the semiconductor substrate in the first implantation step.

9. The semiconductor device manufacturing method according to claim 5, further comprising a first furnace annealing step of performing annealing after the first implantation step, so that a hydrogen-induced donor layer is formed by hydrogen atoms in the first region.

10. The semiconductor device manufacturing method according to claim 9, wherein the charged particle beam irradiation step includes a second furnace annealing step of performing annealing after irradiating the charged particle beam onto the semiconductor substrate.

11. The semiconductor device manufacturing method according to claim 5, wherein an implantation amount of the hydrogen atoms is $1\times10^{13}/cm^2$ or more in the first implantation step.

12. The semiconductor device manufacturing method according to claim 5, wherein an acceleration energy of the hydrogen atoms is 3 MeV or less in the first implantation step.

13. A manufacturing method for a semiconductor device having a semiconductor substrate with one principle surface and an other principle surface opposite to the one principle surface, comprising:
  an element structure forming step of forming an element structure at a one principle surface side of the semiconductor substrate, the element structure including at least a MOS gate structure, an anode layer, a front surface electrode and a termination withstand voltage structure;
  a grinding step of grinding the other principle surface of the semiconductor substrate;
  a p-type impurity ion implantation step of implanting p-type impurity ions in a first region from the other principle surface of the semiconductor substrate, the first region being formed in a surface layer at an other principle surface side;
  an n-type impurity ion implantation of implanting n-type impurity ions in a second region from the other principle surface of the semiconductor substrate, the second region being formed in the surface layer at the other principle surface side and being adjacent to the first region in a plan view of the semiconductor device;
  a hydrogen implantation step of implanting hydrogen atoms in a third region from the other principle surface of the semiconductor substrate so that a hydrogen concentration of the third region is higher than a hydrogen concentration of the semiconductor substrate before starting the manufacturing of the semiconductor device, the third region being formed in the surface layer at the other principle surface side, including the first and second regions, and having a depth from the other principle surface greater than depths of the first and second regions, the hydrogen atoms being implanted into the third region so that dangling bonds of defects in the first and second regions are terminated by the hydrogen atoms, so as to make a lifetime of carriers in the first and second regions to be longer than a lifetime of carriers in the element structure at the one principle surface side; and
  an activation step of activating the p-type impurity ions and the n-type impurity ions by a laser annealing,
  wherein a highest peak of the hydrogen concentration in the third region is located closer to the other principle surface of the semiconductor substrate than is an interface between the third region and the element structure.

14. The semiconductor device manufacturing method according to claim 13, wherein the hydrogen implantation step, and the p-type impurity ion implantation step or the n-type impurity ion implantation step are simultaneously performed.

15. The semiconductor device manufacturing method according to claim 13, wherein the hydrogen implantation step is repeatedly performed before the activation step.

* * * * *